United States Patent
Xie et al.

(10) Patent No.: US 9,312,182 B2
(45) Date of Patent: Apr. 12, 2016

(54) FORMING GATE AND SOURCE/DRAIN CONTACT OPENINGS BY PERFORMING A COMMON ETCH PATTERNING PROCESS

(71) Applicant: GLOBALFOUNDRIES Inc., Grand Cayman (KY)

(72) Inventors: Ruilong Xie, Niskayuna, NY (US); William J. Taylor, Jr., Clifton Park, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/301,748

(22) Filed: Jun. 11, 2014

(65) Prior Publication Data

US 2015/0364378 A1 Dec. 17, 2015

(51) Int. Cl.

| | |
|---|---|
| *H01L 21/8238* | (2006.01) |
| *H01L 21/8234* | (2006.01) |
| *H01L 21/28* | (2006.01) |
| *H01L 27/088* | (2006.01) |
| *H01L 29/06* | (2006.01) |

(52) U.S. Cl.
CPC .. *H01L 21/823437* (2013.01); *H01L 21/28008* (2013.01); *H01L 21/823418* (2013.01); *H01L 21/823431* (2013.01); *H01L 27/088* (2013.01); *H01L 29/0653* (2013.01)

(58) Field of Classification Search
CPC ............... H01L 21/823878; H01L 21/823481; H01L 21/823857; H01L 21/823871; H01L 21/812462; H01L 21/823475; H01L 21/3086
USPC ........................................................ 438/902
See application file for complete search history.

(56) References Cited

U.S. PATENT DOCUMENTS

| | | | | |
|---|---|---|---|---|
| 6,040,606 A | * | 3/2000 | Blair .............................. | 257/384 |
| 8,524,592 B1 | * | 9/2013 | Xie et al. ...................... | 438/595 |
| 8,815,674 B1 | * | 8/2014 | Reimer et al. ................ | 438/199 |
| 2007/0077715 A1 | * | 4/2007 | Kang et al. .................... | 438/299 |
| 2010/0330757 A1 | * | 12/2010 | Lenski et al. ................. | 438/229 |
| 2011/0127613 A1 | * | 6/2011 | Beyer et al. ................... | 257/369 |
| 2011/0241117 A1 | * | 10/2011 | Wei et al. ...................... | 257/355 |
| 2012/0058609 A1 | * | 3/2012 | Lee et al. ...................... | 438/199 |
| 2012/0161243 A1 | * | 6/2012 | Kronholz et al. ............. | 257/369 |

(Continued)

FOREIGN PATENT DOCUMENTS

| | | | | |
|---|---|---|---|---|
| DE | 102009031110 | * | 6/2013 | .......... H01L 21/8238 |
| JP | 2003-234417 | * | 8/2003 | .......... H01L 21/8238 |

OTHER PUBLICATIONS

Machine translation, Nakanishi, Japanese Pat. Pub. No. JP 2003-234417 (translation date: Jul. 29, 2015), Espacenet, all pages.*

*Primary Examiner* — Victoria K Hall
(74) *Attorney, Agent, or Firm* — Amerson Law Firm, PLLC

(57) ABSTRACT

One method disclosed herein includes forming an opening in a layer of material so as to expose the source/drain regions of a transistor and a first portion of a gate cap layer positioned above an active region, reducing the thickness of a portion of the gate cap layer positioned above the isolation region, defining separate initial source/drain contacts positioned on opposite sides of the gate structure, performing a common etching process sequence to define a gate contact opening that extends through the reduced-thickness portion of the gate cap layer and a plurality of separate source/drain contact openings in the layer of insulating material, and forming a conductive gate contact structure and conductive source/drain contact structures.

17 Claims, 29 Drawing Sheets

(56) References Cited

U.S. PATENT DOCUMENTS

| | | | |
|---|---|---|---|
| 2012/0196417 A1* | 8/2012 | Kronholz et al. | 438/275 |
| 2013/0034942 A1* | 2/2013 | Pal et al. | 438/285 |
| 2014/0191295 A1* | 7/2014 | Greene et al. | 257/288 |
| 2014/0256135 A1* | 9/2014 | Javorka et al. | 438/694 |
| 2015/0111373 A1* | 4/2015 | Cote et al. | 438/586 |
| 2015/0270176 A1* | 9/2015 | Xie | H01L 21/823475 257/384 |
| 2015/0287636 A1* | 10/2015 | Wei | H01L 21/823878 257/368 |

* cited by examiner

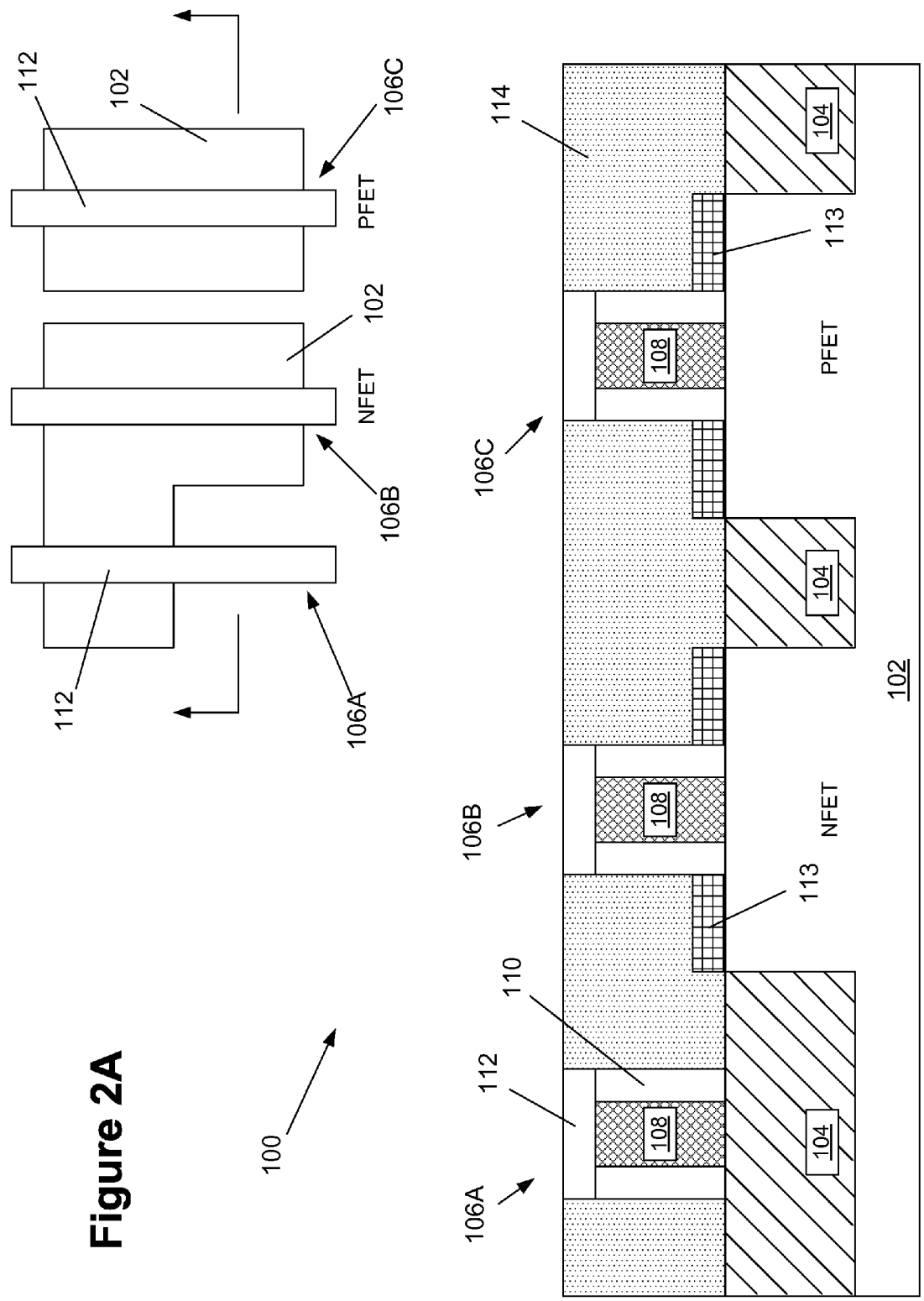

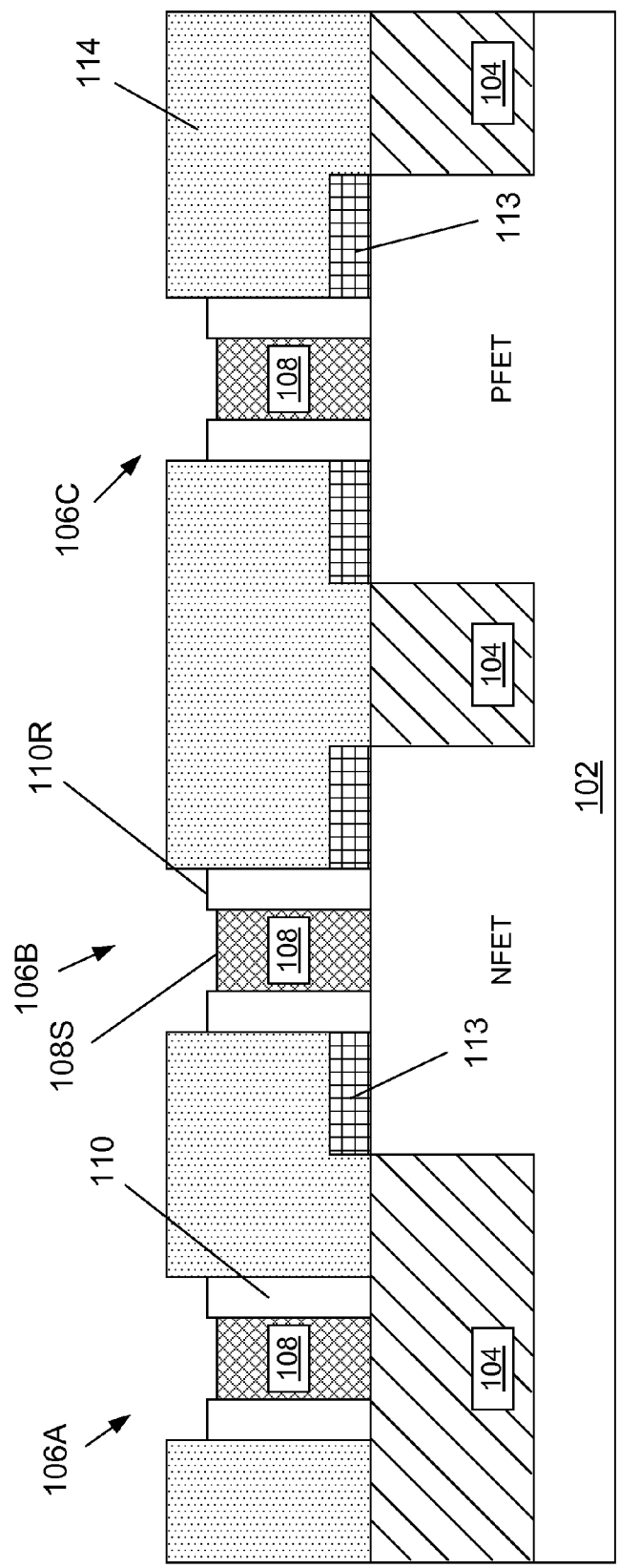

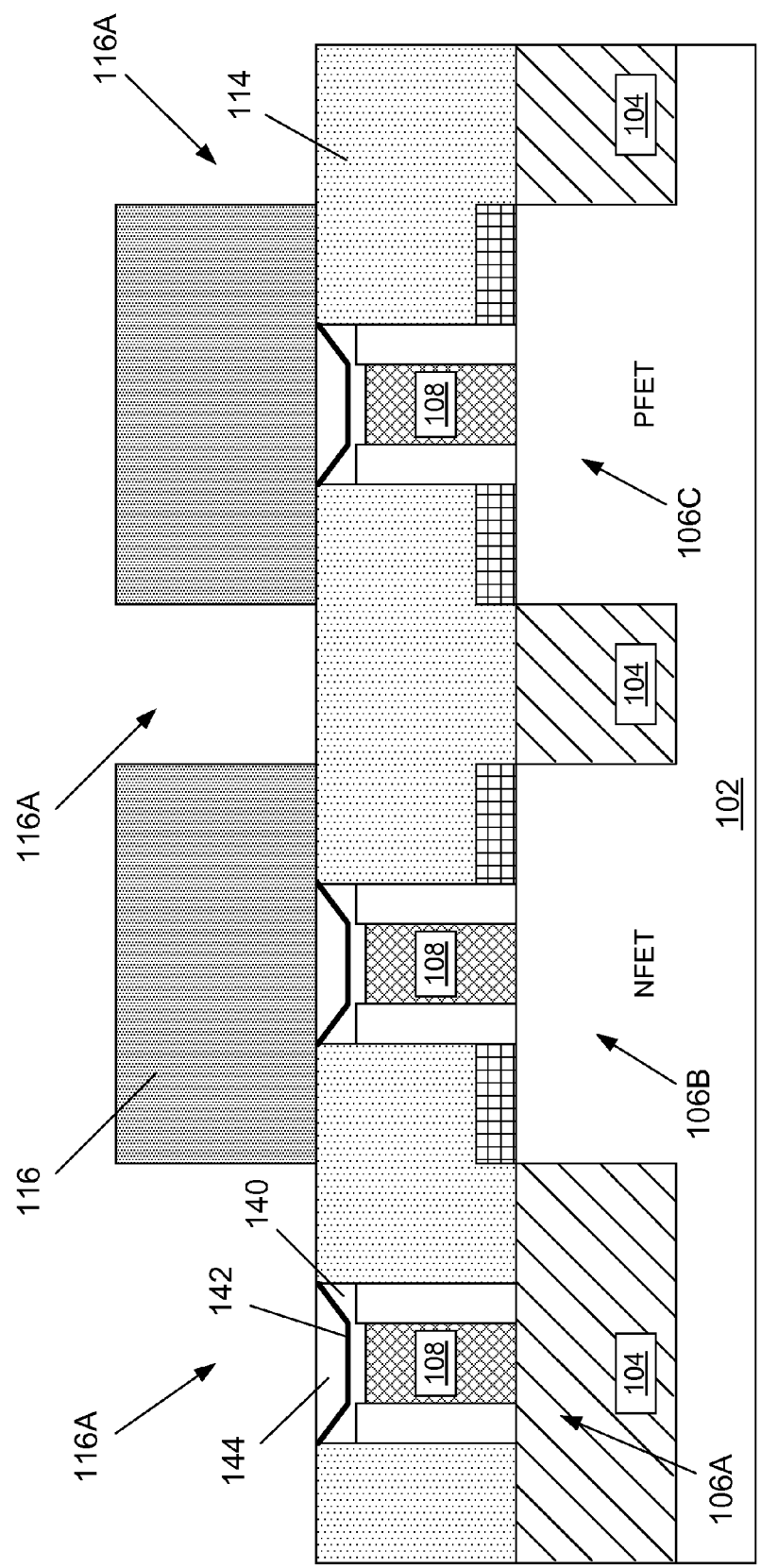

FORMING GATE AND SOURCE/DRAIN CONTACT OPENINGS BY PERFORMING A COMMON ETCH PATTERNING PROCESS

BACKGROUND OF THE INVENTION

1. Field of the Invention

The present disclosure generally relates to the fabrication of integrated circuits, and, more particularly, to various methods of forming gate and source/drain contact openings by performing a common etch patterning process.

2. Description of the Related Art

In modern integrated circuits, such as microprocessors, storage devices and the like, a very large number of circuit elements, especially transistors, are provided and operated on a restricted chip area. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

In sophisticated semiconductor devices, tungsten, in combination with appropriate barrier materials, has proven to be a viable contact metal. When forming tungsten-based contact elements, typically, an interlayer dielectric material is formed first and is patterned so as to define contact openings which extend through the interlayer dielectric material to the corresponding contact areas of the circuit elements, i.e., the source/drain region or the gate structure of a transistor.

FIG. 1A is a cross-sectional view of an integrated circuit product 10 comprised of a plurality of transistor devices formed in and above a semiconductor substrate 12. A schematically depicted isolation region 13 has also been formed in the substrate 12. In the depicted example, the transistor devices are comprised of an illustrative gate structure 14, i.e., a gate insulation layer 14A and a gate electrode 14B, a gate cap layer 16, a sidewall spacer 18 and simplistically depicted source/drain regions 20. At the point of fabrication depicted in FIG. 1A, a layer of insulating material 17A, 17B, i.e., the interlayer dielectric, has been formed above the product 10. Other layers of material, such as contact etch stop layers and the like, are not depicted in the attached drawings. Also depicted are illustrative source/drain contact structures 21 which include a combination of a so-called "trench silicide" (TS) structure 22 and a so-called "CA contact" structure 24. Also depicted is a gate contact structure 26 which is sometimes referred to as a "CB contact" structure. The CB contacts 26 are formed so as to contact a portion of the gate electrode 14B of the gate structure 14. In a plan view, the CB contacts 26 are positioned above the isolation region 13, i.e., the CB contacts 26 are not positioned above the active region defined in the substrate 12. The source/drain contact structures 21 are typically formed as line-type structures that extend across the entire width or a significant portion of the active region in the gate-width direction of the transistor devices.

In older technologies, the CA and CB contacts were typically formed at the same time. However, as device dimensions and gate pitch dimensions decreased, the formation of self-aligned contacts has become necessary so as to avoid creating an electrical short between the CA contact and the gate structure. Typically, the gate structure is fully encapsulated by a silicon nitride cap layer and a silicon nitride sidewall spacer. A layer of insulating material, such as silicon dioxide, is formed on the substrate adjacent the gate structure and above the source/drain regions. To form the opening for the self-aligned source/drain contact structure (CA), an RIE process is typically performed to remove the silicon dioxide material selectively relative to the silicon nitride materials that encapsulate the gate structure. Since formation of the contact opening for the gate contact (CB) necessarily had to involve etching through the silicon nitride gate cap layer, the formation of the CA contacts and the CB contact could not be performed at the same time. That is, performing a common CA/CB etching process with an etchant that would remove portions of the silicon nitride gate cap layer (so as to form the CB contact opening) would consume the protective silicon nitride sidewall spacers and the silicon nitride gate cap layer adjacent the contact openings for the CA contacts, thereby exposing the gate structure to the CA contact openings.

In one embodiment, the process flow of forming the TS structures 22, CA contacts 24 and CB contacts 26 may be as follows. After a first layer of insulating material 17A is deposited, TS openings are formed in the first layer of insulating material 17A that expose portions of underlying source/drain regions 20. Thereafter, traditional silicide is formed through the TS openings, followed by forming tungsten (not separately shown) on the metal silicide regions, and performing a CMP process down to the top of the gate cap layer 16. Then, a second layer of insulating material 17B is deposited and contact openings for the CA contacts 24 are formed in the second layer of insulating material 17B that expose portions of the underlying tungsten metallization. Next, the opening for the CB contact 26 is formed in the second layer of insulating material 17B and through the gate cap layer 16 so as to expose a portion of the gate electrode 14B. Typically, the CB contact 26 is in the form of a round or square plug. Thereafter, the CA contacts 24 and the CB contact 26 are formed in their corresponding openings in the second layer of insulating material 17B by performing one or more common deposition and CMP process operations, using the second layer of insulating material 17B as a polish-stop layer to remove excess material positioned outside of the contact openings. The CA contacts 24 and CB contact 26 typically contain a uniform body of metal, e.g., tungsten, and may also include one or more metallic barrier layers (not shown) positioned between the uniform body of metal and the layer of insulating material 17B. The source/drain contact structures 21 (TS contacts 22, CA contacts 24) and the CB contact 26 are all considered to be device-level contacts within the industry.

Also depicted in FIG. 1A is the first metallization layer—the so-called M1 layer—of the multi-level metallization system for the product 10. A plurality of conductive vias—so-called V0 vias—is provided to establish electrical connection between the device-level contacts—CA contacts 24 and the CB contact 26—and the M1 layer. The M1 layer typically includes a plurality of metal lines that are routed as needed across the product 10. The M1 lines 30 and the V0 structures 28 are typically comprised of copper, and they are formed in a layer of insulating material 19 using known damascene or dual-damascene techniques. Additional metallization layers (not shown) are formed above the M1 layer, e.g., M2/V1, M3/V2, etc. As depicted, the device-level contacts are all positioned at a level that is below the level of the V0 structures.

FIG. 1B depicts another illustrative arrangement of device-level contacts that may be employed on the product 10. Relative to the example depicted in FIG. 1A, in FIG. 1B, the V0 structures have been omitted and the CA contacts 24 and the CB contact 26 have been extended vertically. In this example, the device-level contacts 24, 26 are all positioned at a level that is below the level of the metal lines 30 in the M1 layer.

As noted above, in a typical process flow, the CA contacts 24 and the CB contact 26 are formed at different times using two different mask layers to define the contact openings. Reducing the number of masks needed to manufacture an integrated circuit product reduces the cost of manufacturing. Thus, it would be highly desirable to form the openings for the CA contacts and the CB contacts using a single masking layer. Exposure technologies such as EUV, or even double patterning processes, make the formation of such closely spaced contact openings possible from a patterning point of view. However, in forming the opening for the gate contact (CB), the etching process must punch through the gate cap layer, which is typically made of silicon nitride. In contrast, when forming the source/drain contacts (CA), the etching process must be designed so as to stop on the silicon nitride hard mask (and silicon nitride spacers) so as not to create an electrical short circuit between the gate structure and the source/drain contact. Thus, current methodologies prevent the formation of the contact openings for both the gate contact and the source/drain contacts at the same time, thereby adding increased cost to manufacturing.

The present disclosure is directed to various methods of methods of forming gate and source/drain contact openings by performing a common etch patterning process that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate and source/drain contact openings by performing a common etch patterning process. One method disclosed herein includes, among other things, forming at least one layer of material above an active region, forming an opening in the at least one layer of material so as to expose the source/drain regions of a transistor and a first portion of a gate cap layer positioned above the active region, performing a first recess etching process on a second portion of the gate cap layer positioned above the isolation region so as to thereby define a reduced-thickness second portion of the gate cap layer positioned above the isolation region, performing at least one second recess etching process to recess the conductive material so as to define separate initial source/drain contacts positioned on opposite sides of the gate structure, forming an insulating material above the source/drain contacts and above the reduced-thickness second portion of the gate cap layer, performing a common etching process sequence through a patterned masking layer to define a gate contact opening that extends through the reduced-thickness second portion of the gate cap layer and a plurality of separate source/drain contact openings in the layer of insulating material, each of which are positioned above one of the initial source/drain contacts, and forming a conductive gate contact structure in the gate contact opening such that it is conductively coupled to the gate structure and a conductive source/drain contact structure in each of the source/drain contact openings such that the conductive source/drain contact structure is conductively coupled to an underlying initial source/drain contact.

Another illustrative method disclosed herein includes, among other things, forming a gate structure that is positioned above an active region and an isolation region, forming a gate cap layer above the gate structure, the gate cap layer having a substantially uniform full thickness above the entire gate structure, performing at least one first recess etching process on a first portion of the gate cap layer positioned above the isolation region while masking a second portion of the gate cap layer positioned above the active region so as to thereby define a gate cap layer comprised of a reduced-thickness portion positioned above the isolation region and a full thickness portion positioned above the active region, forming a gate contact opening that extends through the reduced-thickness portion of the gate cap layer and exposes the gate structure, and forming a gate contact in the gate contact opening.

One illustrative device disclosed herein includes, among other things, an isolation region that defines an active region in a semiconducting substrate, a gate structure, wherein the gate structure has an axial length such that a first portion of the gate structure is positioned above the active region and a second portion of the gate structure is positioned above the isolation region, and a gate cap layer positioned above the gate structure, wherein a first portion of the gate cap layer that is positioned above the first portion of the gate structure is thicker than a second portion of the gate cap layer that is positioned above the second portion of the gate structure.

BRIEF DESCRIPTION OF THE DRAWINGS

The disclosure may be understood by reference to the following description taken in conjunction with the accompanying drawings, in which like reference numerals identify like elements, and in which:

FIGS. 3A-3K depict other illustrative methods disclosed herein for forming gate and source/drain contact openings by performing a common etch patterning process.

Figure 1A:
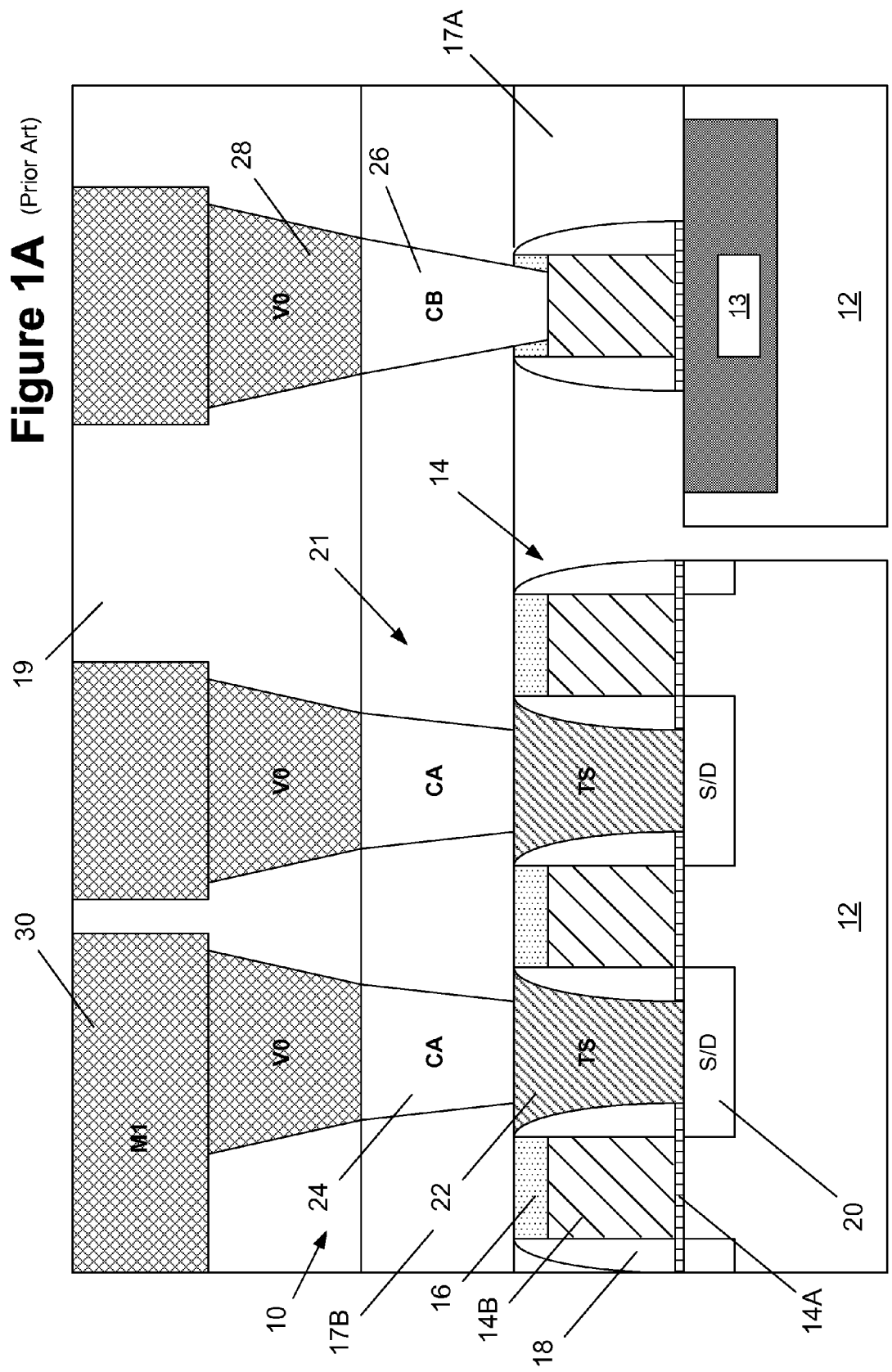
FIGS. 1A-1B depict various illustrative prior art arrangements of device-level contacts and metallization layers for an integrated circuit product.
Figure 1B:
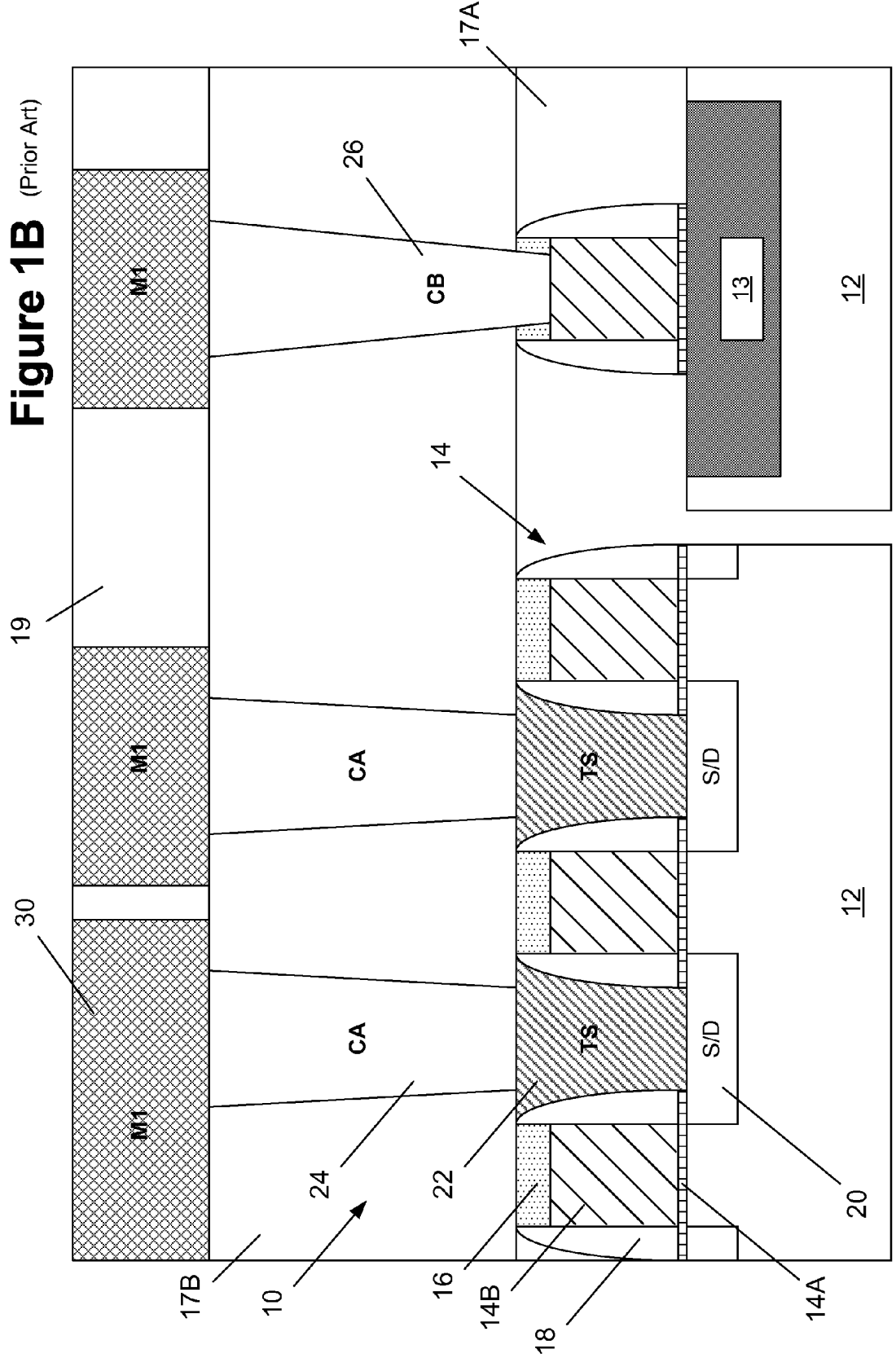

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to forming gate and source/drain contact openings by performing a common etch patterning process. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2B:
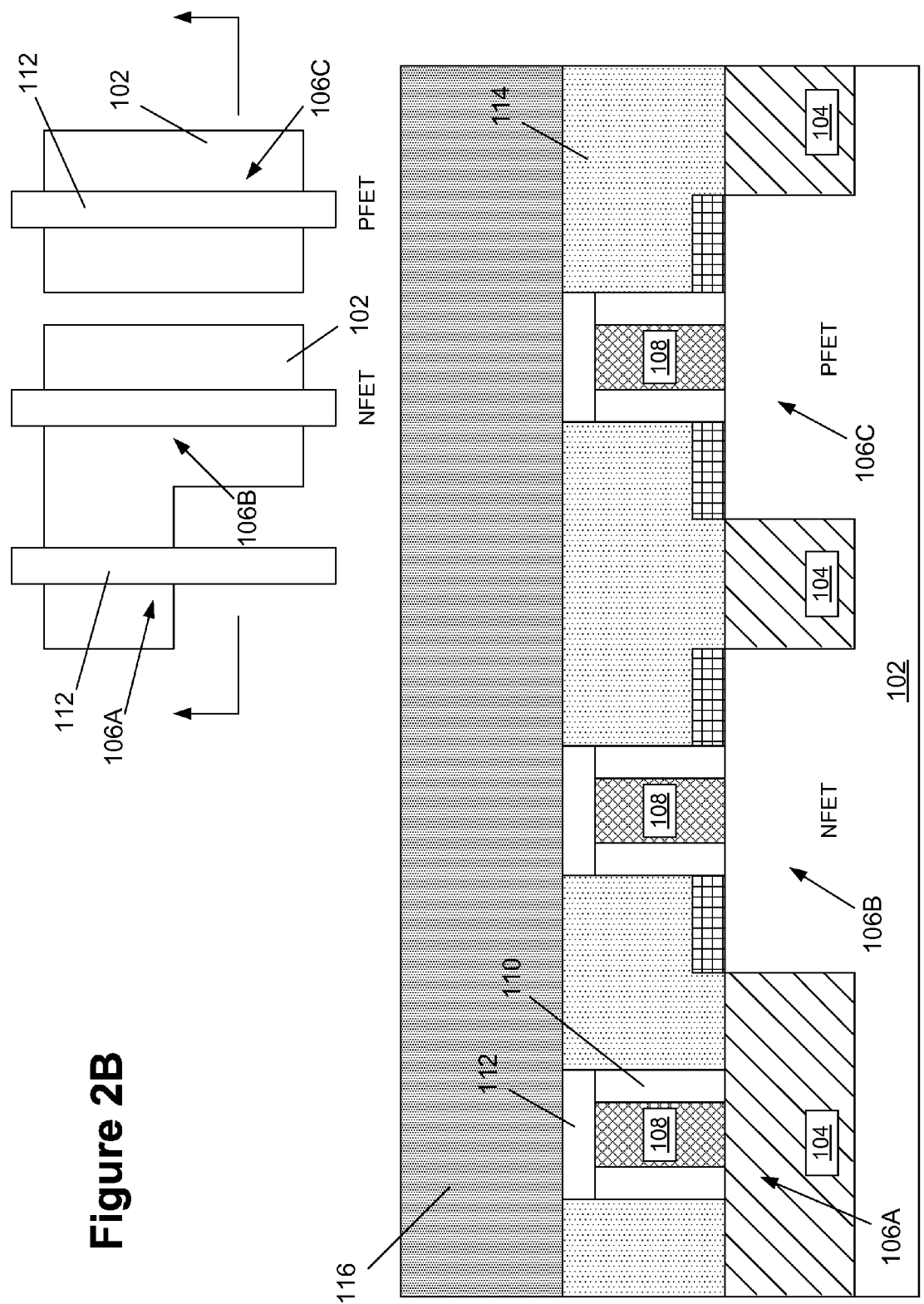
FIGS. 2A-2P depict various methods disclosed herein for forming gate and source/drain contact openings by performing a common etch patterning process.
Figure 2C:
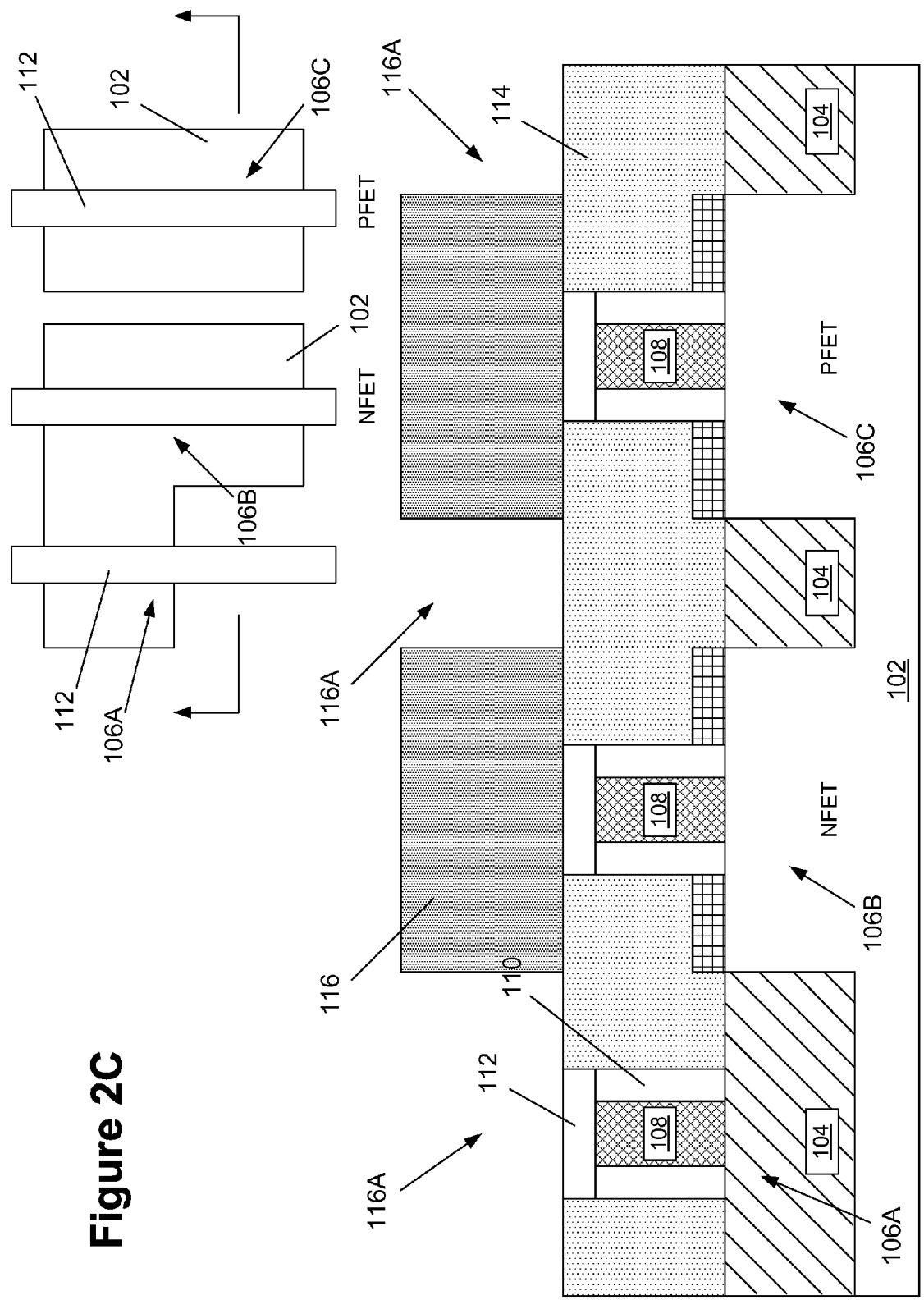
Figure 2D:
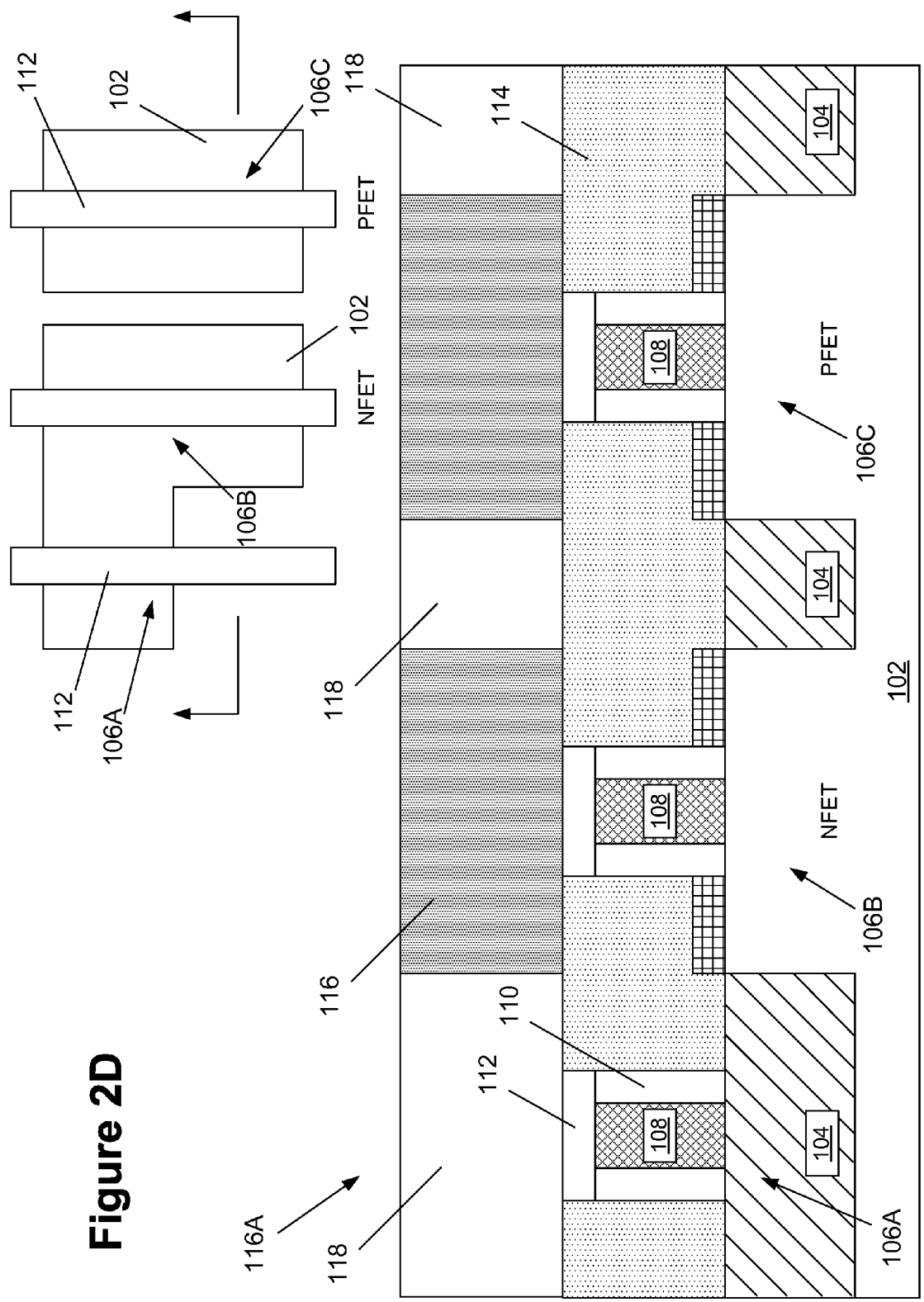
Figure 2E:
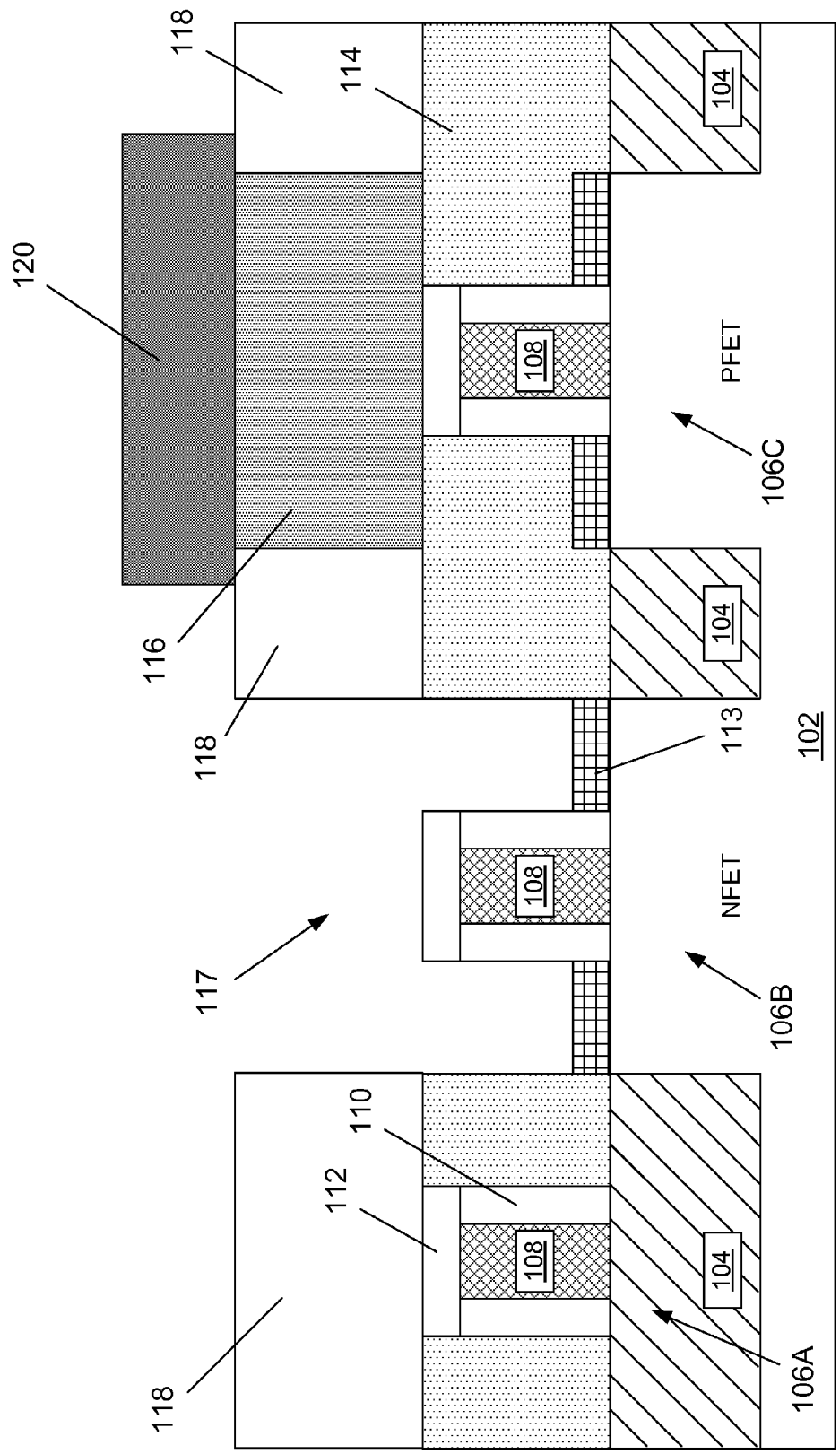
Figure 2F:
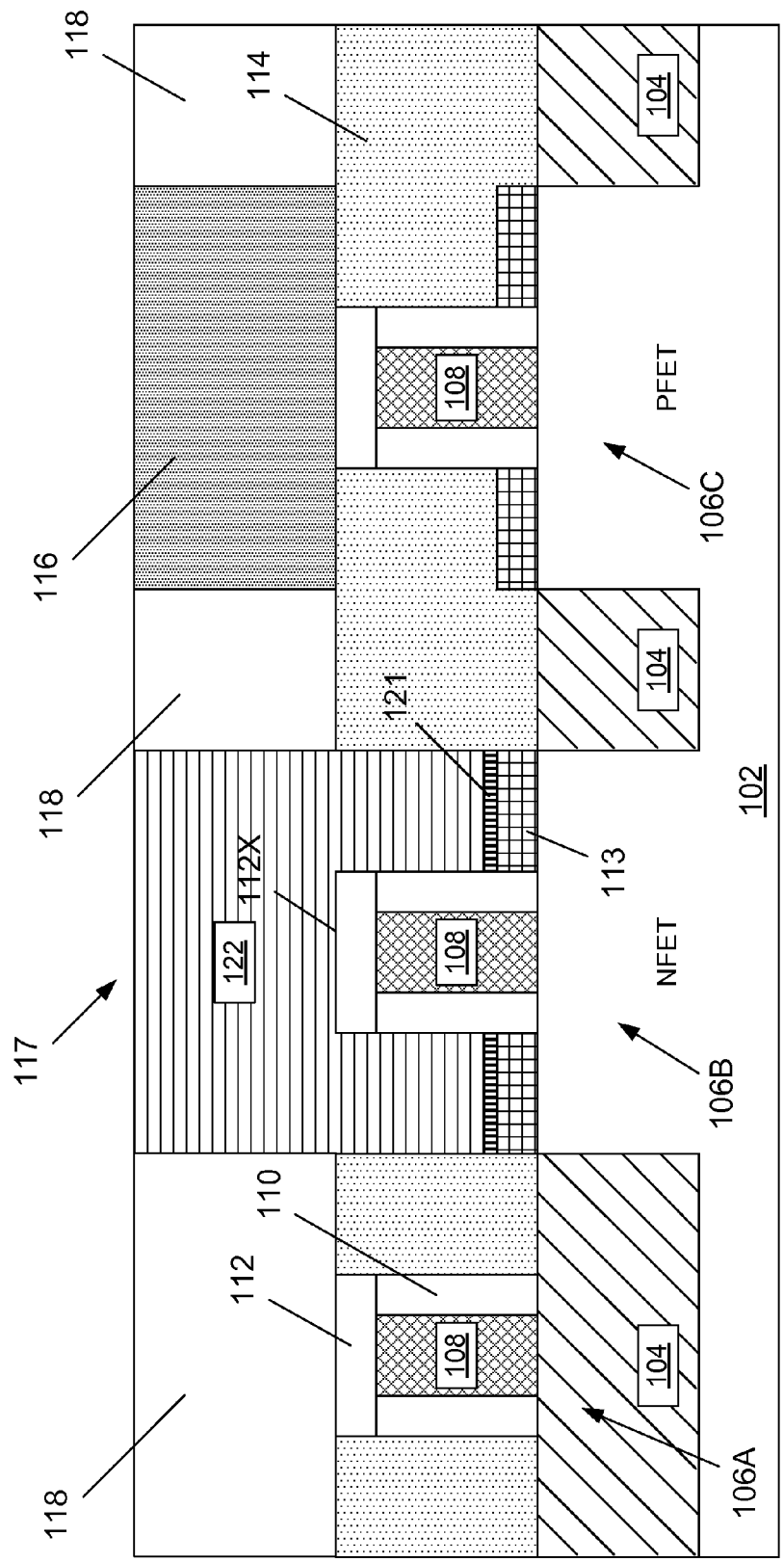
Figure 2G:
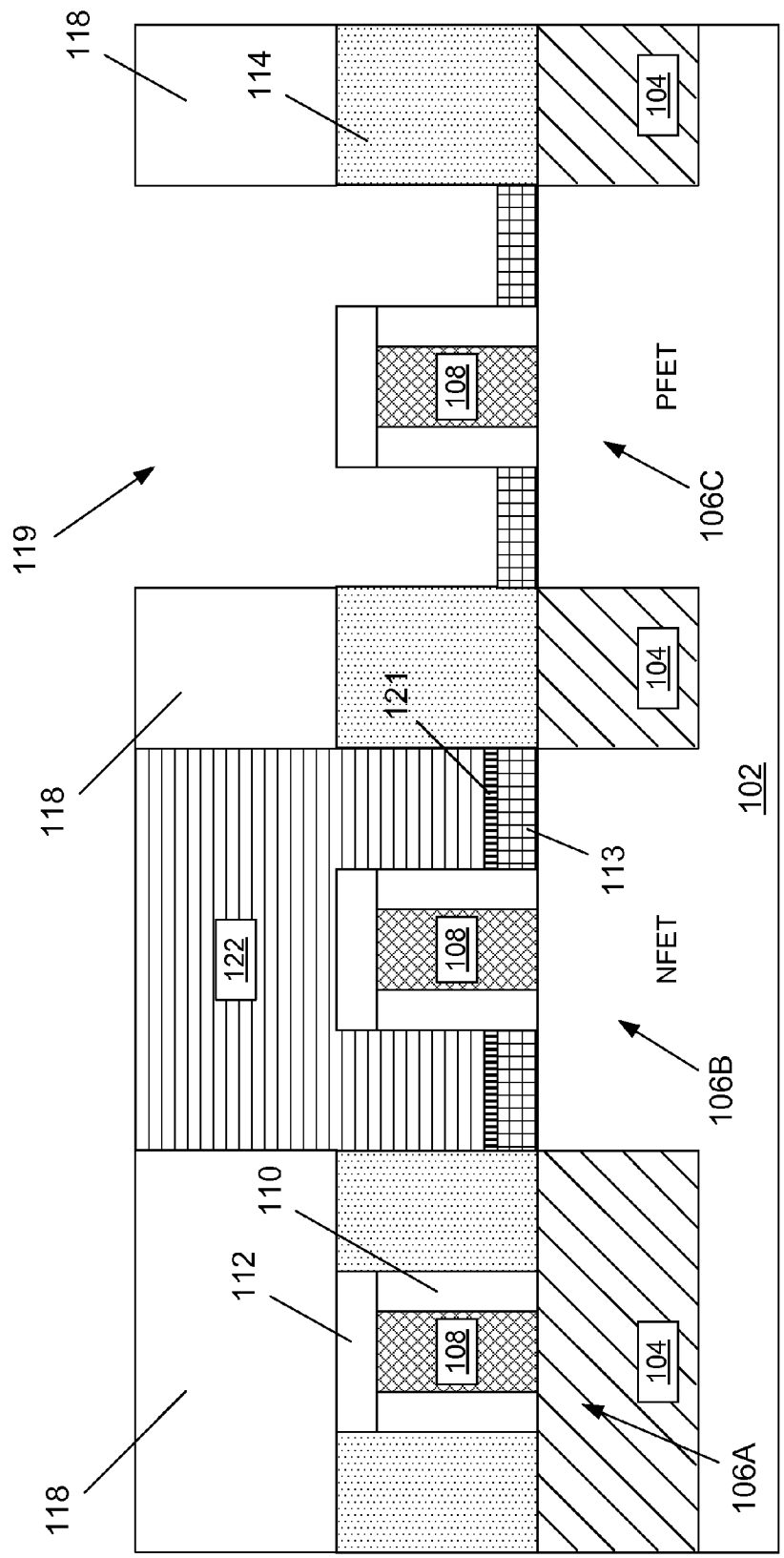
Figure 2H:
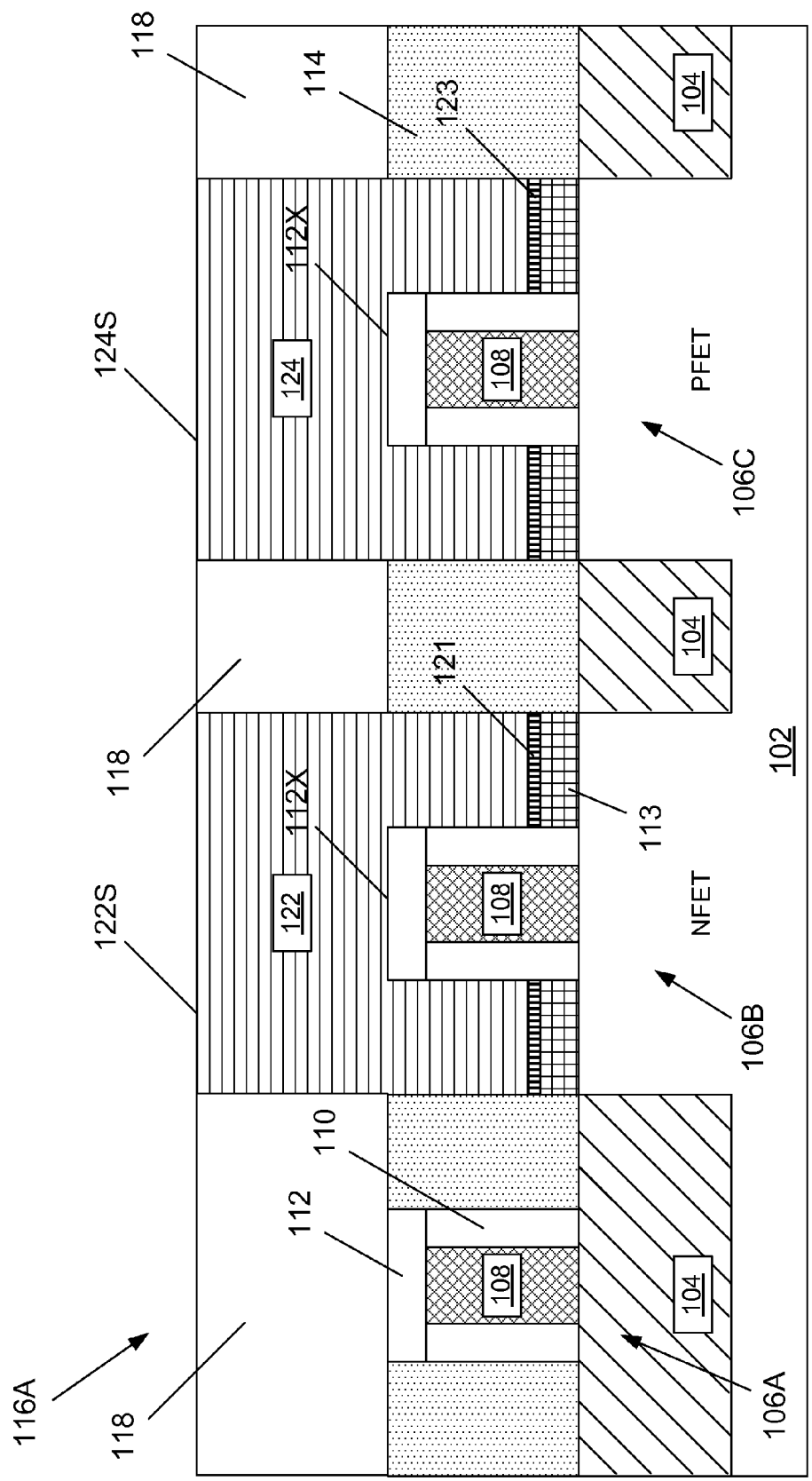
Figure 2I:
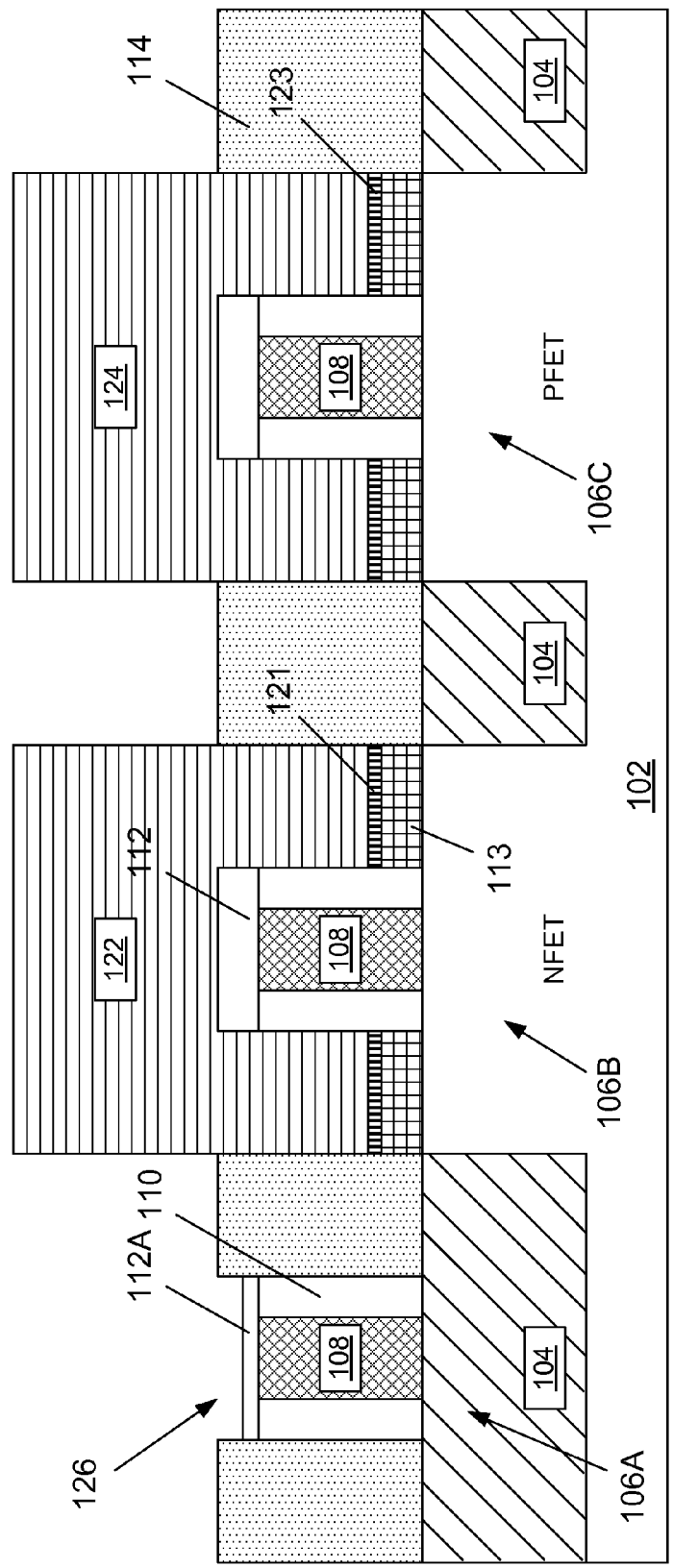
Figure 2J:
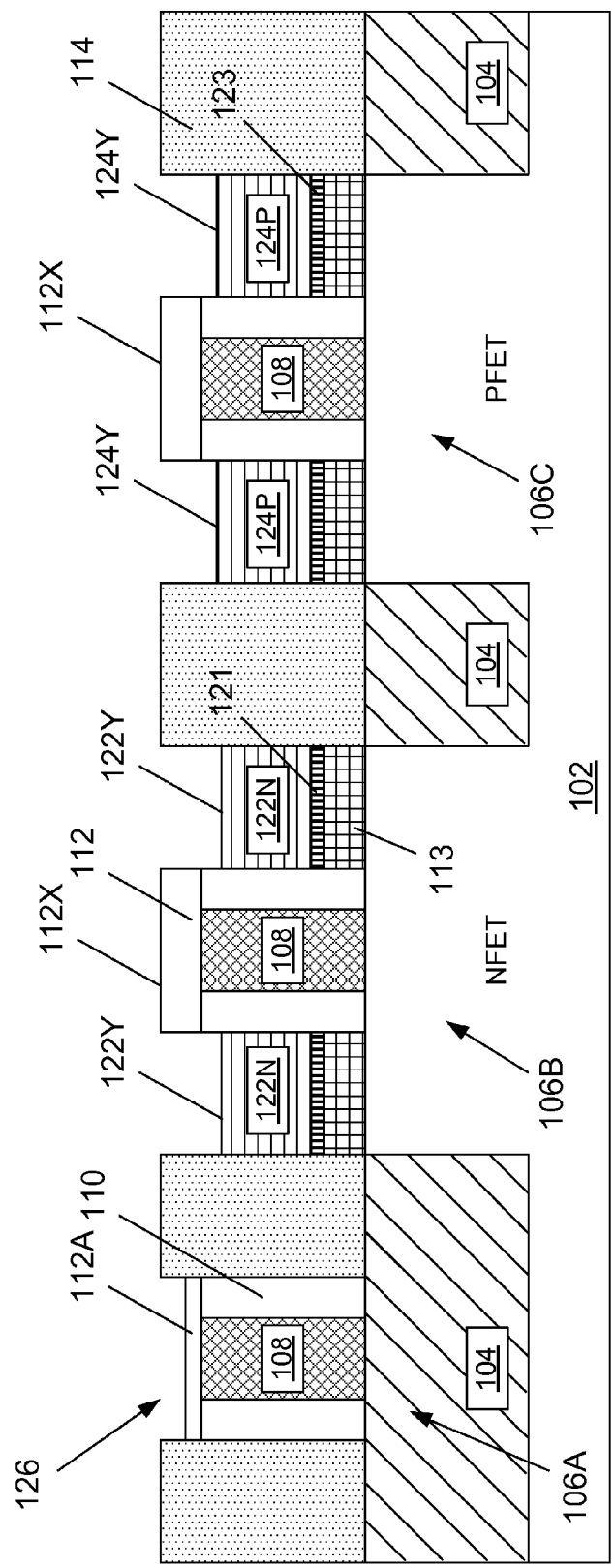
Figure 2K:
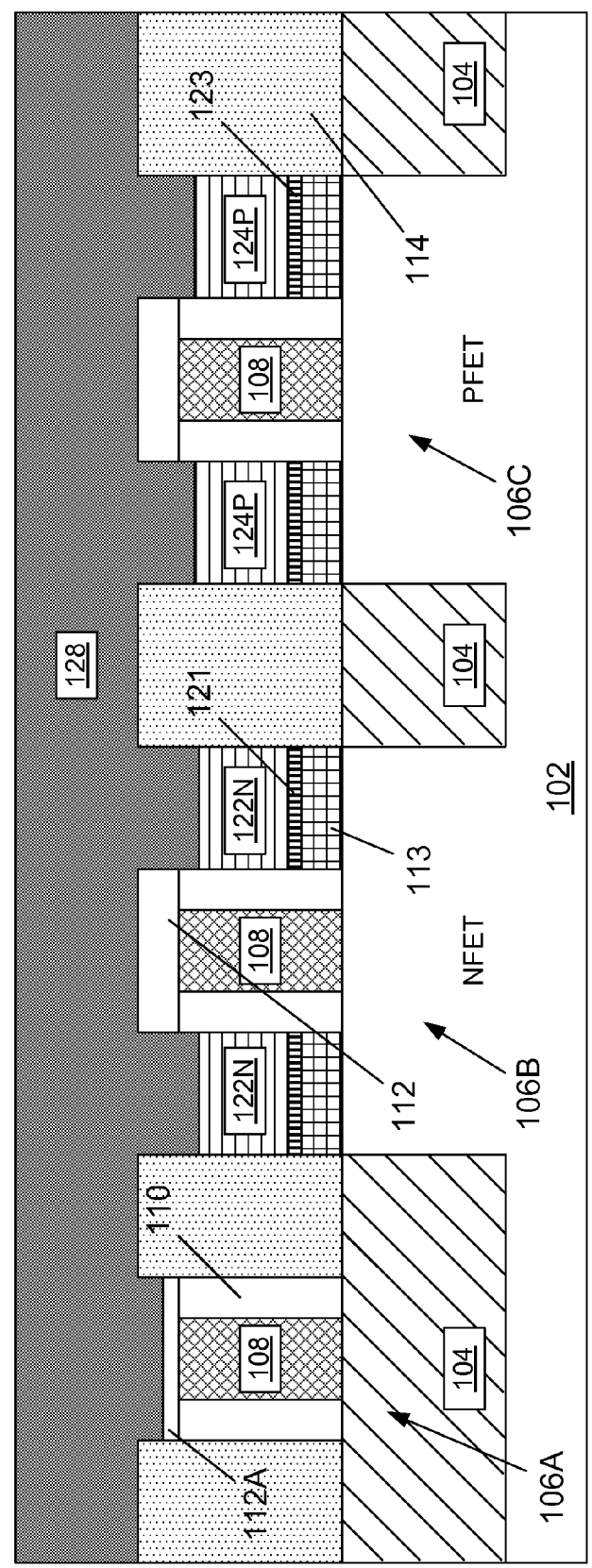
Figure 2L:
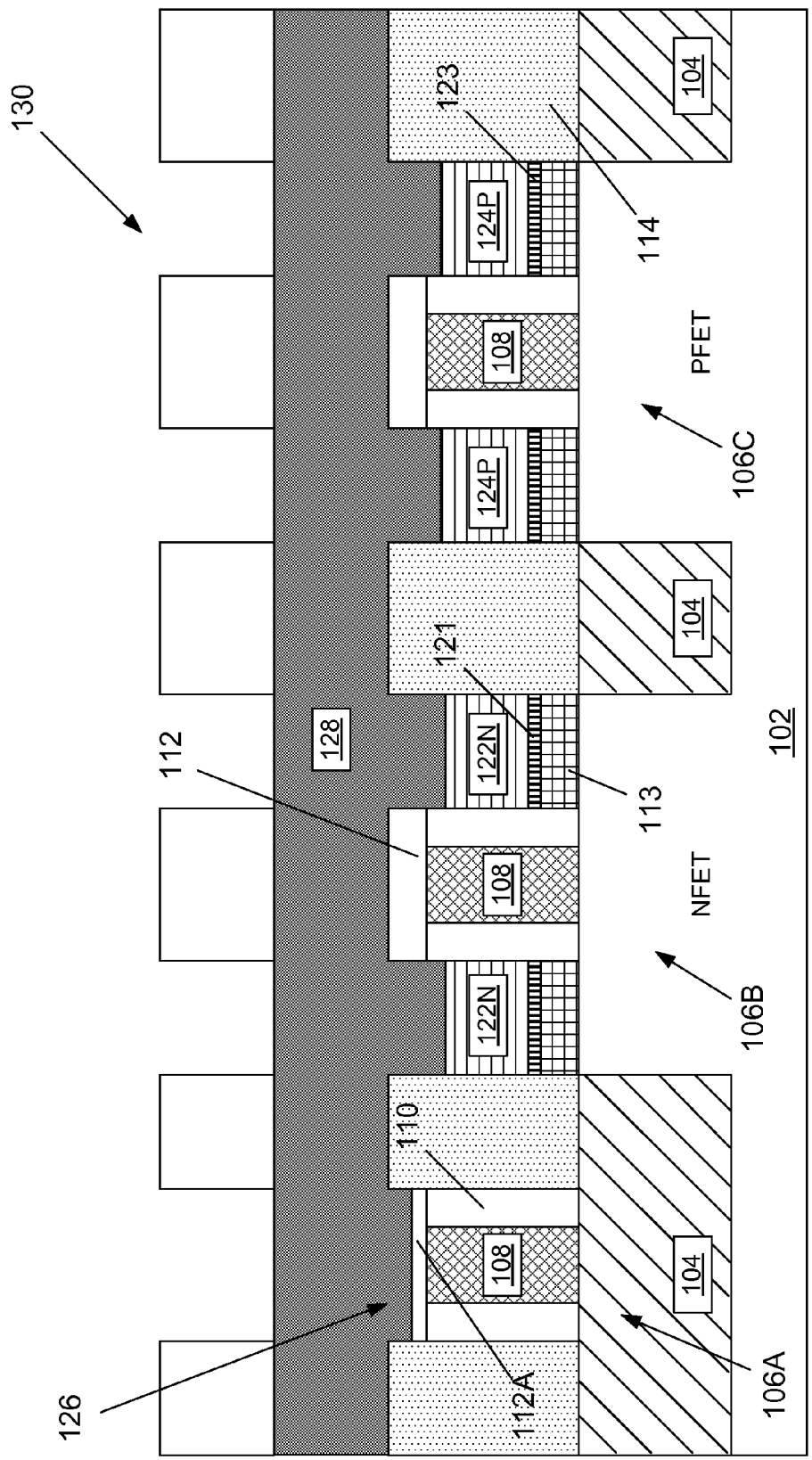
Figure 2M:
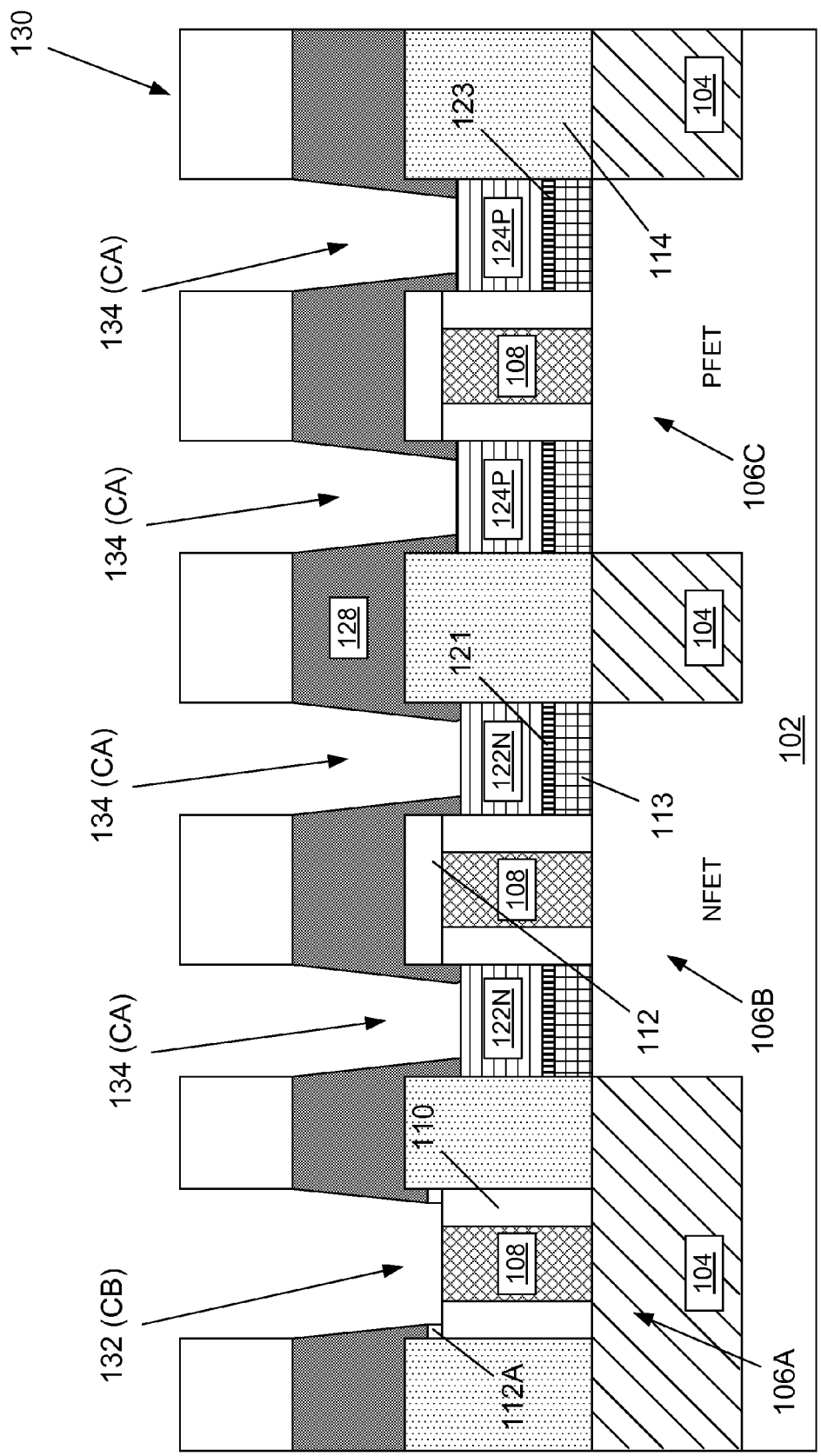
Figure 2N:
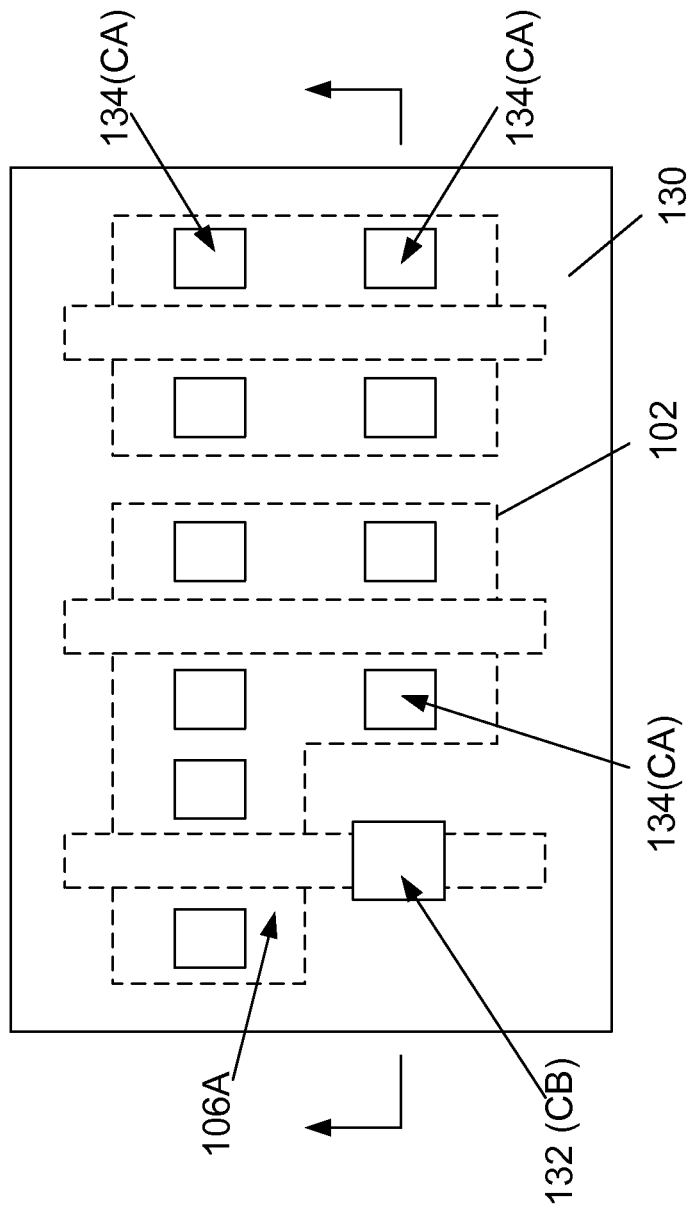
Figure 2O:
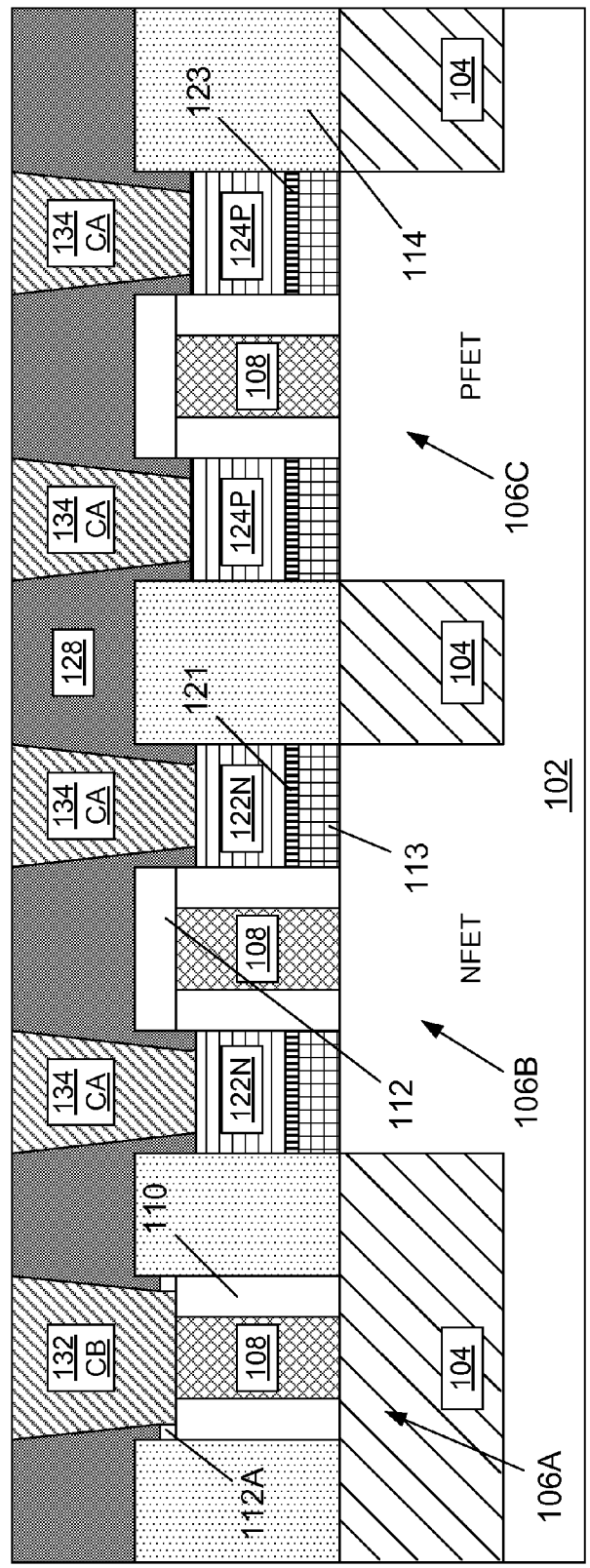
Figure 2P:
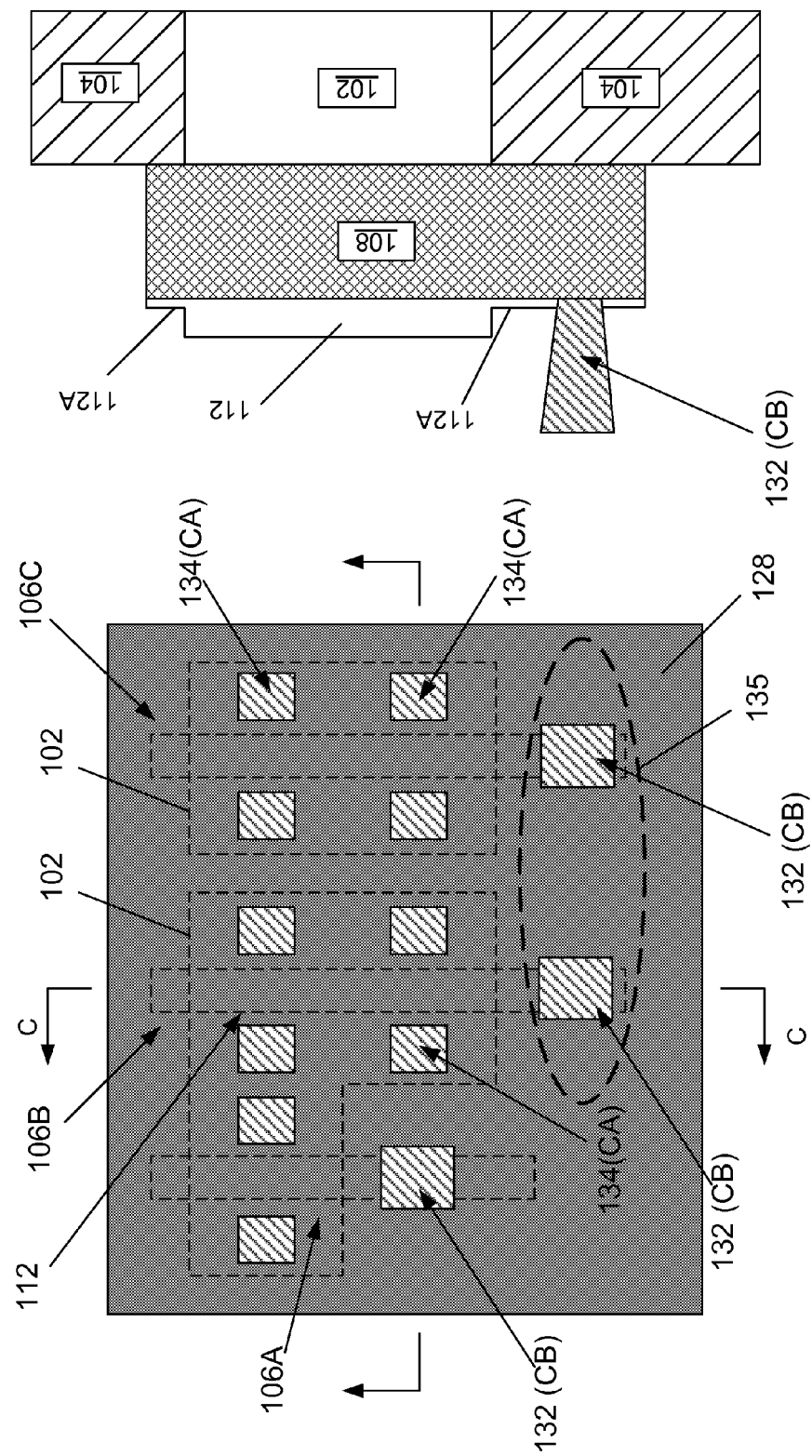

FIGS. 2A-2P depict various methods disclosed herein for forming gate and source/drain contact openings by performing a common etch patterning process. Many of the drawings contain a simplistic plan view of the product 100 in the upper right-hand corner of the drawings. The cross-sectional view depicted in the drawings is taken where indicated in the plan view of the drawings. In general, using the method disclosed herein, conductive contact structures will be formed for the gate structures and the source/drain regions of the transistor devices. In the cross-sectional views depicted herein, the gate contact structure will only be depicted as being formed on one of the three gate structures. Of course, as will be appreciated by those skilled in the art, gate contact structures and source/drain contact structures will all be formed for all of the devices at the same time.

The illustrative product 100 will be formed in and above a semiconductor substrate 102. The transistor devices depicted herein may be either NMOS or PMOS transistors, they may be any type of transistor device, e.g., either planar or FinFET transistor devices, and the gate structures of such devices may be formed by performing well-known gate-first or replacement gate processing techniques. Additionally, various doped regions, e.g., halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 2A is a cross-sectional view of the integrated circuit product 100 comprised of a plurality of transistor devices formed in and above the semiconductor substrate 102. At the point of fabrication depicted in FIG. 2A, schematically depicted isolation regions 104, e.g., shallow trench isolation regions, have been formed in the substrate 102. The isolation regions 104 define an active region for an NFET device and another active region for a PFET device. Three illustrative and schematically depicted gates 106A, 106B and 106C have been formed above the substrate 102 at this point in the process flow. In the depicted example, the gates 106A-C are comprised of a simplistically depicted gate structure 108, a gate cap layer 112, simplistically depicted sidewall spacers 110 and raised epi source/drain regions 113. Such raised epi source/drain regions may be omitted if desired. In one illustrative embodiment, the schematically depicted gate structure 108 includes an illustrative gate insulation layer (not separately shown) and an illustrative gate electrode (not separately shown). The gate insulation layer may be comprised of a variety of different materials, such as, for example, silicon dioxide, a so-called high-k (k greater than 10) insulation material (where k is the relative dielectric constant), etc. Similarly, the gate electrode may also be of a material such as polysilicon or amorphous silicon, or it may be comprised of one or more metal layers that act as the gate electrode. As will be recognized by those skilled in the art after a complete reading of the present application, the gate structure 108 of the transistor devices depicted in the drawings, i.e., the gate insulation layer and the gate electrode, is intended to be representative in nature. That is, the gate structure 108 may be comprised of a variety of different materials and it may have a variety of configurations, and the gate structure 108 may be made using either the so-called "gate-first" or "replacement gate" techniques.

With continuing reference to FIG. 2A, a first layer of insulating material 114, i.e., the interlayer dielectric, has been formed above the product 100. Thereafter, a CMP process was performed to planarize the layer of insulating material 114. Depending upon the technique selected for forming the gates 106A-C, the gate cap layer 112 may be formed prior to formation of the layer of insulating material 114 or it may be formed after the formation of the layer of insulating material 114. The layer of insulating material 114 may be made from a variety of materials, e.g., silicon dioxide, and it may be formed by performing, for example, a CVD process.

FIG. 2B depicts the product 100 after a second layer of insulating material 116 was formed above the first layer of insulating material 114. The layers of insulating material 114, 116 may be made of the same or different materials.

FIG. 2C depicts the product after the second layer of insulating material 116 was patterned to define a plurality of openings 116A therein. The second layer of insulating material 116 may be patterned by forming a patterned etch mask (not shown), such as a patterned layer of photoresist material above the second layer of insulating material 116, and thereafter performing an etching process. The patterned second layer of insulating material 116 protects the underlying active regions while the openings 116A are positioned above the isolation regions 104. In some cases, the footprints of the islands of patterned layer of insulating material correspond to the footprints of the active regions defined in the substrate 102 for both the NFET and PFET devices.

FIG. 2D depicts the product 100 after a layer of material 118 was deposited in the openings 116A and after a CMP process was performed using the patterned second layer of insulating material 116 as a polish stop layer. In one illustrative embodiment, the layer of material 118 may be made of the same material as that of the gate cap layer 112 and the sidewall spacers 110, e.g., silicon nitride.

FIG. 2E depicts the device 100 after several process operations were performed. First, a patterned masking layer 120, e.g., a patterned layer of photoresist material, was formed so as to cover the portion of the patterned second layer of insulating material 116 positioned above the PFET region. Thereafter, one or more etching processes were performed to remove the exposed portion of the first and second layers of insulating material 114, 116 so as the thereby define an opening 117. In one illustrative embodiment, the formation of the opening 117 exposes the underlying source/drain regions, i.e., the raised source/drain regions 113 depicted herein. In other cases, a thin contact etch stop layer (not shown) (e.g., silicon nitride) may be present above the source/drain regions. In the example depicted herein, the first opening 117 is formed above the NFET device. However, as will be appreciated by those skilled in the art after a complete reading of the present application, if desired, the first opening 117 could have also been formed above the PFET device.

FIG. 2F depicts the device 100 after several process operations were performed. First, the patterned mask layer 120 was removed. Then, illustrative metal silicide regions 121 were formed on the source/drain regions 113 of the NFET device using traditional techniques. Using the methods disclosed herein, the silicide material may be tailored for each type of device, e.g., the metal silicide regions 121 may be tailored so as to reduce N-type contact resistance for the NFET device, e.g., titanium silicide. Thereafter, conductive contact material 122 was formed so as to fill the opening 117. The conductive contact material 122 is intended to be representative in nature in that it is intended to represent any type of conductive materials that may be used in forming conductive structures on integrated circuit products, e.g., tungsten, copper, etc. Moreover, the conductive contact material 122 may comprise one or more barrier layers (not shown). The conductive contact material 122 may be formed by overfilling the opening 117 and thereafter performing one or more CMP processes to remove excess conductive material 122 positioned outside of the opening 117.

FIG. 2G depicts the device 100 after one or more etching processes were performed to remove the exposed portion of the first and second layers of insulating material 114, 116 positioned above the PFET device so as the thereby define an opening 119.

FIG. 2H depicts the device 100 after several process operations were performed. First, illustrative metal silicide regions 123 were formed on the source/drain regions of the PFET device using traditional techniques. As noted above, using the methods disclosed herein, the metal silicide regions 123 may be tailored so as to reduce P-type contact resistance for the PFET device, e.g., NiPt silicide. Thereafter, conductive contact material 124 was formed so as to fill the opening 119. The conductive contact material 124 is also intended to represent any type of conductive materials that may be used in forming conductive structures on integrated circuit products, e.g., tungsten, copper, etc. The conductive contact material 124 may be formed by overfilling the opening 119 and thereafter performing one or more CMP processes to remove excess conductive material 124 positioned outside of the opening 119. Note that, at this point in the process flow, the upper surfaces 122S, 124S of the conductive materials 122, 124, respectively, are positioned above the upper surfaces 112X of the gate cap layers 112 for the gates 106B, 106C, respectively.

As an alternative, if the metal silicide materials for the NFET and PFET devices are the same, the process flow can be modified. That is, starting at the point depicted in FIG. 2D, the oxide materials 116 and 114 positioned above both the NFET and PFET device may be removed so as to form the openings 117, 119 at the same time. At that point, the metal silicide material may be formed on the raised epi source/drain regions 113 of both the NFET and PFET devices. Thereafter, the conductive materials 122, 124 may be formed in the openings 117, 119 by performing common deposition and CMP processes so as to arrive at the structure depicted in FIG. 2H.

FIG. 2I depicts the device 100 after a timed recess etching process was performed to remove the material layer 118 selectively relative to the first layer of insulating material 114 and the conductive materials 122, 124, i.e., the portions of the cap layer 112 positioned above the active regions are masked by the conductive materials 122, 124 during the recess etching process. The etching process is timed such that a recessed gate cap layer 112A is formed above the portions of the gates 106A, 106B and 106C that are not covered by the conductive materials 122, 124, i.e., the portion of the original gate cap layers 112 positioned above the isolation region 104 is reduced in thickness, while the portions of the original gate cap layers 112 having the original thickness are masked by the conductive materials. A recess 126 is formed above the recessed gate cap layer 112A as a result of this process operation. A gate contact opening will eventually be formed through a portion of the recessed gate cap layer 112A at the desired location for a gate contact structure. The thickness of the recessed gate cap layer 112A may vary depending upon the particular application. That is, the recessed gate cap layer 112A may have a nominal thickness of about 2-10 nm, whereas the full thickness gate cap layer 112 may have a nominal thickness of about 20-50 nm. Stated another way, the reduced thickness, recessed gate cap layer 112A may have a thickness that is about 10-20% of the thickness of the full thickness portion of the gate cap layer 112.

FIG. 2J depicts the device 100 after a timed recess etching process was performed to selectively remove portions of the conductive materials 122, 124 relative to the surrounding materials and structures. This recess etching process results in the formation of separate NFET initial source/drain contacts 122N (positioned on opposite sides of the gate structure 108 of the NFET device) and separate PFET initial source/drain contacts 124P (positioned on opposite sides of the gate structure 108 of the PFET device). The thickness or height of the initial source/drain contacts 122N, 124P may vary depending upon the particular application. Note that, at this point in the process flow, the upper surfaces 122Y, 124Y of the initial source/drain contacts 122N and PFET source/drain contacts 124P, respectively, are positioned below the upper surfaces 112X of the gate cap layers 112 for the gates 106B, 106C, respectively. Note that the recessed gate cap layer 112A protects the gate structure 108 during the recessing of the conductive material 122, 124.

FIG. 2K depicts the product 100 after another layer of insulating material 128 was formed across the product and after a CMP process was performed. The layer of insulating material 128 may be made of the same or different materials as used for the layer of insulating material 114.

FIG. 2L depicts the product after a patterned etch mask 130, e.g., a patterned layer of photoresist material, was formed above the layer of insulating material 128. The openings in the patterned etch mask 130 correspond to locations where contact structures will be formed for the product 100.

FIGS. 2M and 2N (plan view) depict the product 100 after one or more etching processes were performed through the patterned etch mask 130 to define a gate contact opening for a gate contact structure 132(CB) and to define a plurality of source/drain contact openings for a plurality of source/drain contact structures 134(CA). The size, shape, number and configurations of the gate contact structures 132(CB) and the source/drain contact structures 134(CA) may vary depending upon the device under construction. For example, rather than the depicted discrete square contacts 134(CA), the source/drain contact structures may be line-type features. Due to the reduced thickness of the recessed cap layer 112A in the area where the gate contact 132(CB) will be formed, a common etching process may be performed to form the openings for the source/drain contact structures 134(CA) and the gate contact structures 132(CB), i.e., the openings may be formed at the same time. Even if the gate cap materials and the sidewall spacer materials are comprised of the same material, the common etching process will break through the relatively thin recessed cap layer 112A (thereby forming the opening for the gate contact 132(CB)) and can be stopped before breaking through the full thickness gate cap layer 112. The same would apply even in the case where a self-aligned contact process is performed, the gate contact 132(CB) would be formed before too much of the full-thickness gate cap layer is penetrated or before too much of the sidewall spacer 110 is consumed.

FIGS. 2O and 2P (plan view) depict the product 100 after the patterned etch mask 130 was removed and after various operations were performed to form the gate contact 132(CB) that is conductively coupled to the gate structure 108 and the source/drain contact structures 134(CA) that are conductively coupled to the initial source/drain contacts 122N, 124P. As noted previously, the gate contact structures and source/drain contacts will all be formed at the same time for all of the devices. Accordingly, FIG. 2P also depicts the formation of gate contacts 132(CB) to the gates 106B, 106C, as indicated in the dashed-line region 135. The gate contact 132(CB) and the source/drain contacts 134(CA) are intended to be representative in nature in that it is intended to represent any type of contact structures that may be used on integrated circuit products, e.g., tungsten, copper, etc. Moreover, the gate contact 132(CB) and the source/drain contacts 134(CA) may comprise one or more barrier layers (not shown). The gate contact 132(CB) and the source/drain contacts 134(CA) may be formed by overfilling the contact openings with the desired materials and thereafter performing one or more CMP processes to remove excess conductive material positioned outside of the contact openings above the layer of insulating material 128. FIG. 2P also contains a cross-sectional (view "C-C") taken through the long axis of the gate 106B so as to further describe the unique gate cap structures disclosed herein. As depicted, the gate structure 108 has a first portion positioned above the active region 102 and second portion(s) that are positioned above the isolation region 104. In the depicted example, the full thickness gate cap layer portion 112 is positioned above the active region 102, while the reduced thickness portions of the gate cap layer 112A are positioned above the isolation region 104. That is, when viewed in this cross-sectional view, the novel gate cap layer disclosed herein has a stepped cross-sectional profile. The simplistically depicted gate contact 132 (CB) is shown as penetrating the reduced thickness portion 112A of the gate cap layer and contacting the gate structures 108.

FIGS. 3A-3K depict other illustrative methods disclosed herein for forming gate and source/drain contact openings by performing a common etch patterning process. In this embodiment, a unique multi-layer gate cap structure may be formed for the gates 106A-C.

Figure 3A:
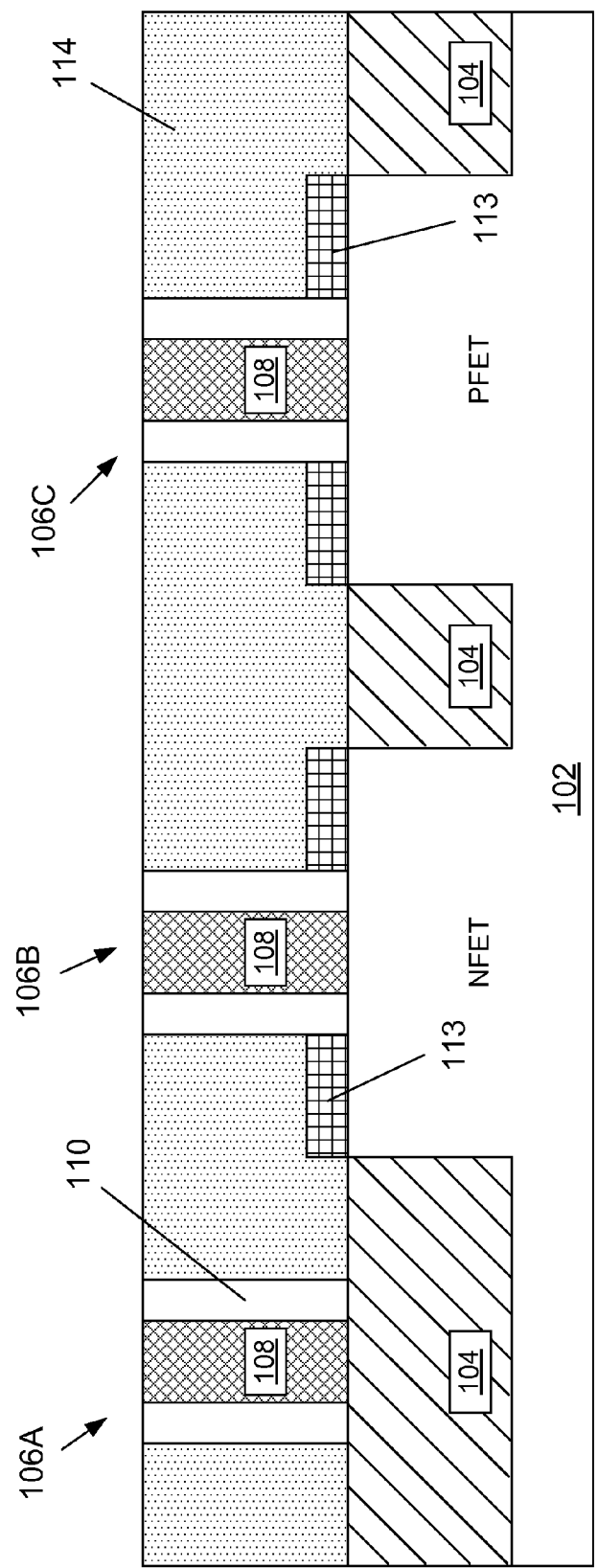

FIG. 3A depicts the device at a point in fabrication that corresponds approximately to that shown in FIG. 2A except that the gate cap layer 112 shown in FIG. 2A has yet to be formed. That is, at the point in fabrication depicted in FIG. 3A, a planarization process was performed such that the upper surfaces of the gate structures 108 are exposed.

Figure 3B:
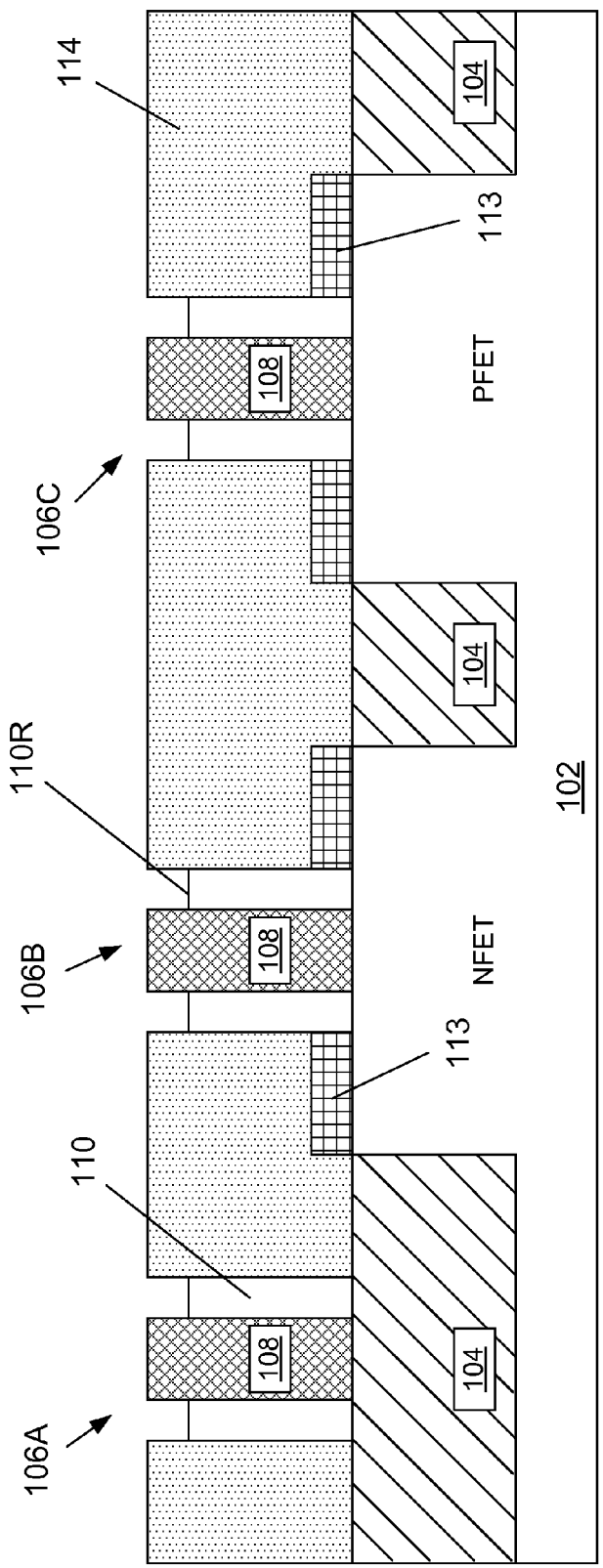

FIG. 3B depicts the device 100 after a recess etching process was performed on the spacers 110 such that the spacers 110 have a recessed upper surface 110R. The amount or extent of recessing of the spacers 110 may vary depending upon the particular application, e.g., 30-50 nm.

FIG. 3C depicts the device 100 after a recess etching process was performed on the gate structures 108 such that the gate structures 108 have a recessed upper surface 108S that is positioned below the recessed upper surface 110R of the spacers 110. The amount or extent of recessing of the gate structures 108 may vary depending upon the particular application.

Figure 3D:
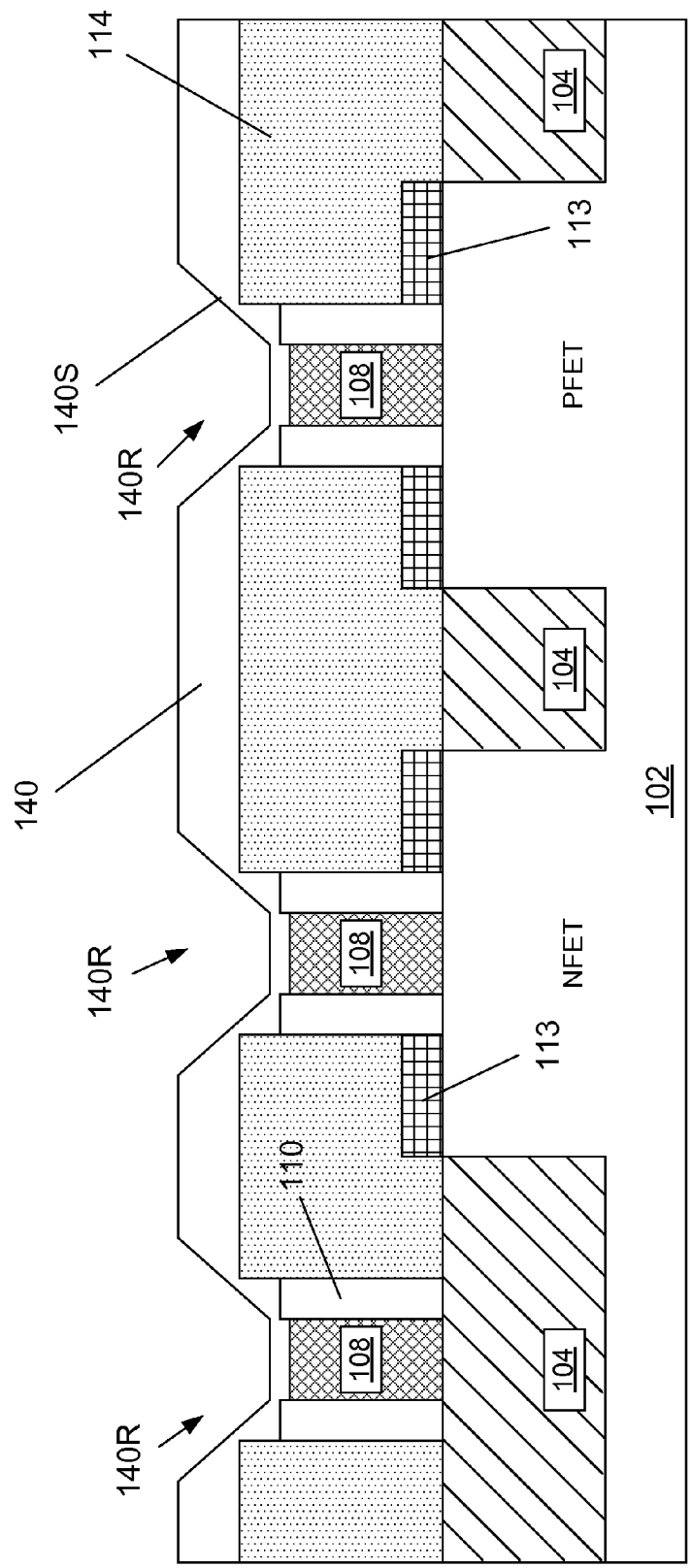

FIG. 3D depicts the device 100 after a high density plasma CVD and etching process operation (hereinafter "HDP CVD-etching process") was performed to form a first gate cap material layer 140. In general, the HDP CVD-etching process is a combination of deposition/etch cycles that results in the first gate cap material layer 140 having an as-deposited, non-planar upper surface 140S. The HDP CVD-etching process typically involves performing a series of CVD deposition and etching processes in a common process chamber without breaking vacuum or transferring the wafer to another chamber, e.g., deposition-etch-deposition-etch, etc. The number and duration of the deposition-etch sequences performed in the HDP CVD-etching process may vary depending upon the particular application and may vary depending upon factors such as the depth and CD of the opening into which the material is to be deposited. The precise parameters of the HDP CVD-etching process for any particular application may need to be determined based upon experimentation and testing techniques that are within the skill level of those skilled in the art. In one embodiment, the HDP CVD-etching process involves use of $SiH_4$, $N_2/NH_3$ and Ar, where the argon has a sputtering type effect at the same time CVD film deposition is occurring. In one embodiment, during the etching portion of the HDP CVD-etching process, $NF_3$ is used as an etchant gas. However, using the HDP CVD-etching process described herein, the top corner region of an opening, i.e., the region where overhang normally occurs during a standard CVD process, was etched more than the regions inside the opening. The combination of the $NF_3$ etching and the argon sputtering, along with the deposition sequencing, resulted in the first gate cap material layer 140 having the as-deposited, non-planar upper surface 140S. In one embodiment, the first gate cap material layer 140 may be made of an HDP silicon nitride, SiCN, SiBN, etc. The thickness of the first gate cap material layer 140 may vary depending upon the particular application.

Figure 3E:
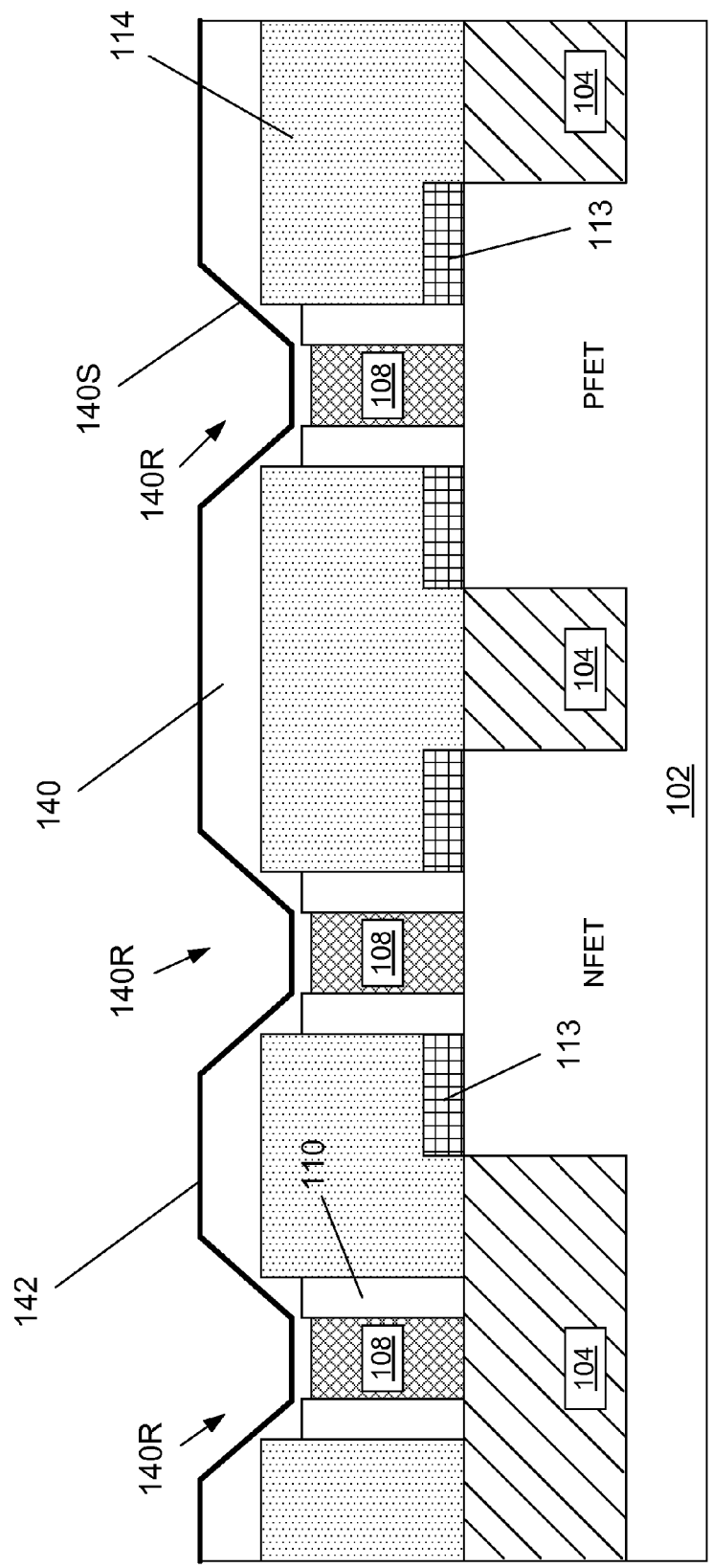

FIG. 3E depicts the device 100 after several process operations were performed. First, a high-k protection layer 142 (simplistically depicted as a very thick line) was conformably deposited on the product 100 by performing, for example, a conformal ALD or CVD processes. Due to the non-planar upper surface 140S of the first gate cap material layer 140, the high-k protection layer 142 also has a non-planar upper surface. After the formation of the high-k protection layer 142, portions of the recess 140R remain unfilled above the high-k protection layer 142. In one illustrative embodiment, the high-k protection layer 142 may be comprised of a material having a dielectric constant (k) greater than 10, e.g., hafnium oxide, aluminum oxide, etc. The thickness of the high-k protection layer 142 may vary depending upon the particular application, e.g., 2-6 nm.

Figure 3F:
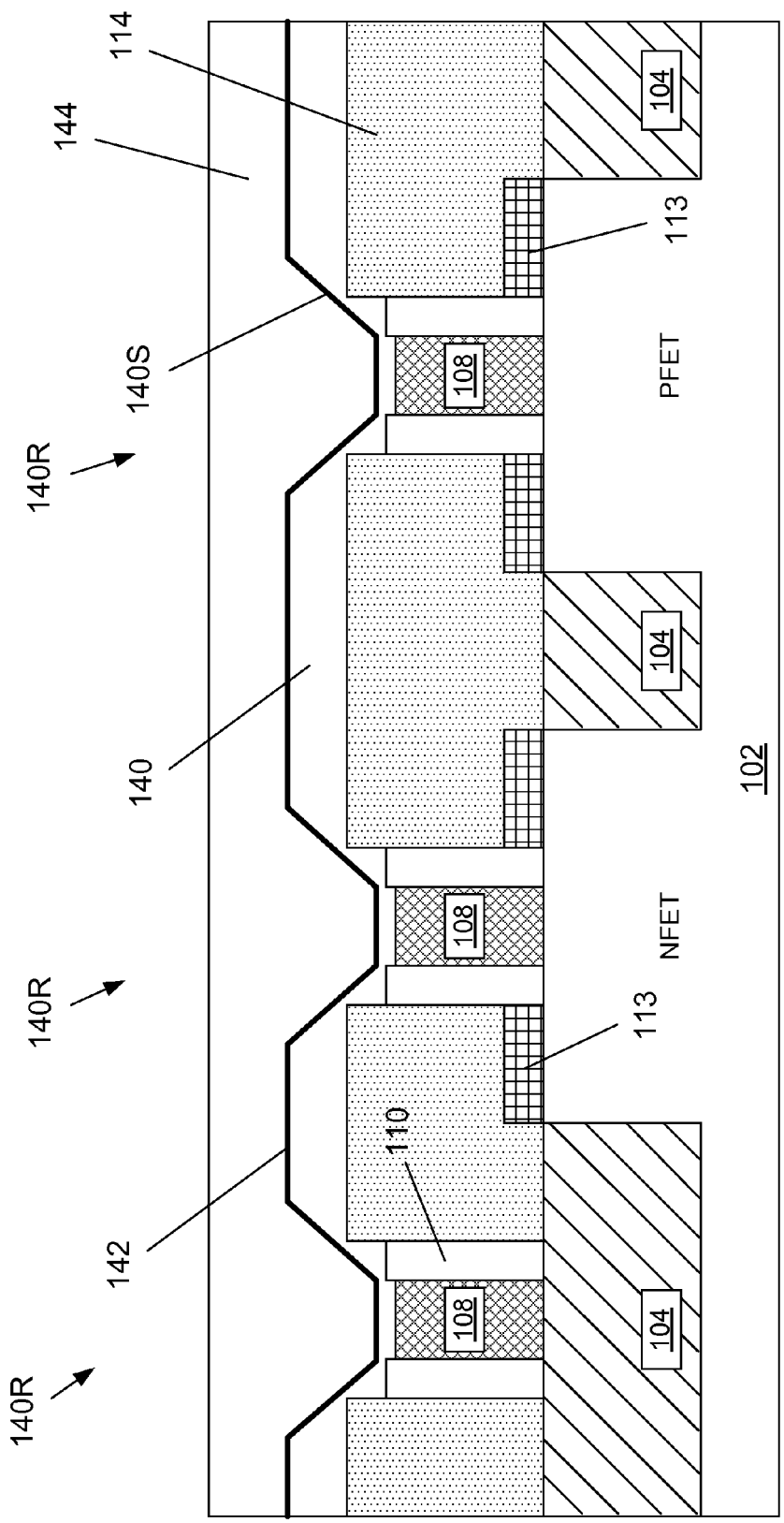

FIG. 3F depicts the device 100 after a second gate cap material layer 144 was deposited on the non-planar upper surface of the high-k protection layer 142 so as to overfill the recesses 140R. The second gate cap material layer 144 may be comprised of the same materials as those of the first gate cap material layer 140.

Figure 3G:
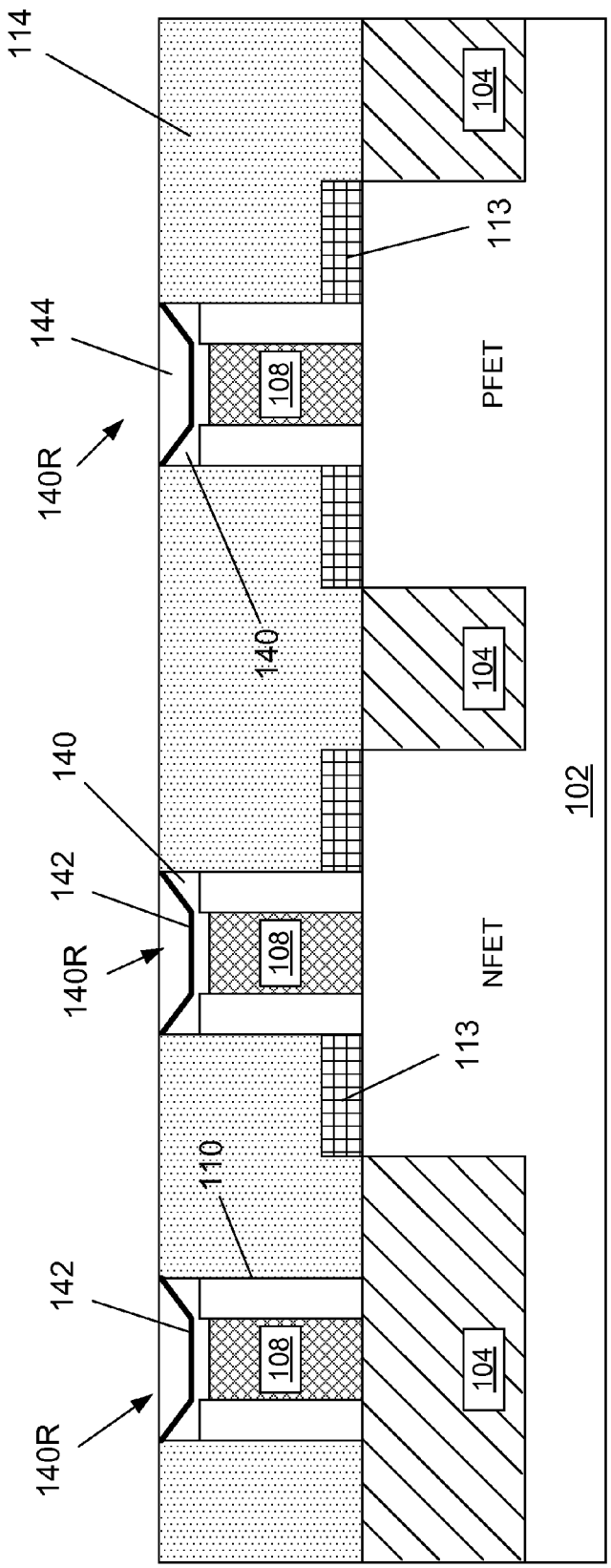

FIG. 3G depicts the device 100 after one or more CMP processes was performed using the layer of insulating material 114 as a polish-stop layer. This process removes excess portions of the high-k protection layer 142, the first gate cap material layer 140 and the second gate cap layer 144 positioned above the layer of insulating material 114 outside of the recess 140R.

FIG. 3H depicts the device 100 at a point in fabrication that corresponds to that shown in FIG. 2C, i.e., after the second layer of insulating material 116 was patterned to define the openings 116A therein.

Figure 3I:
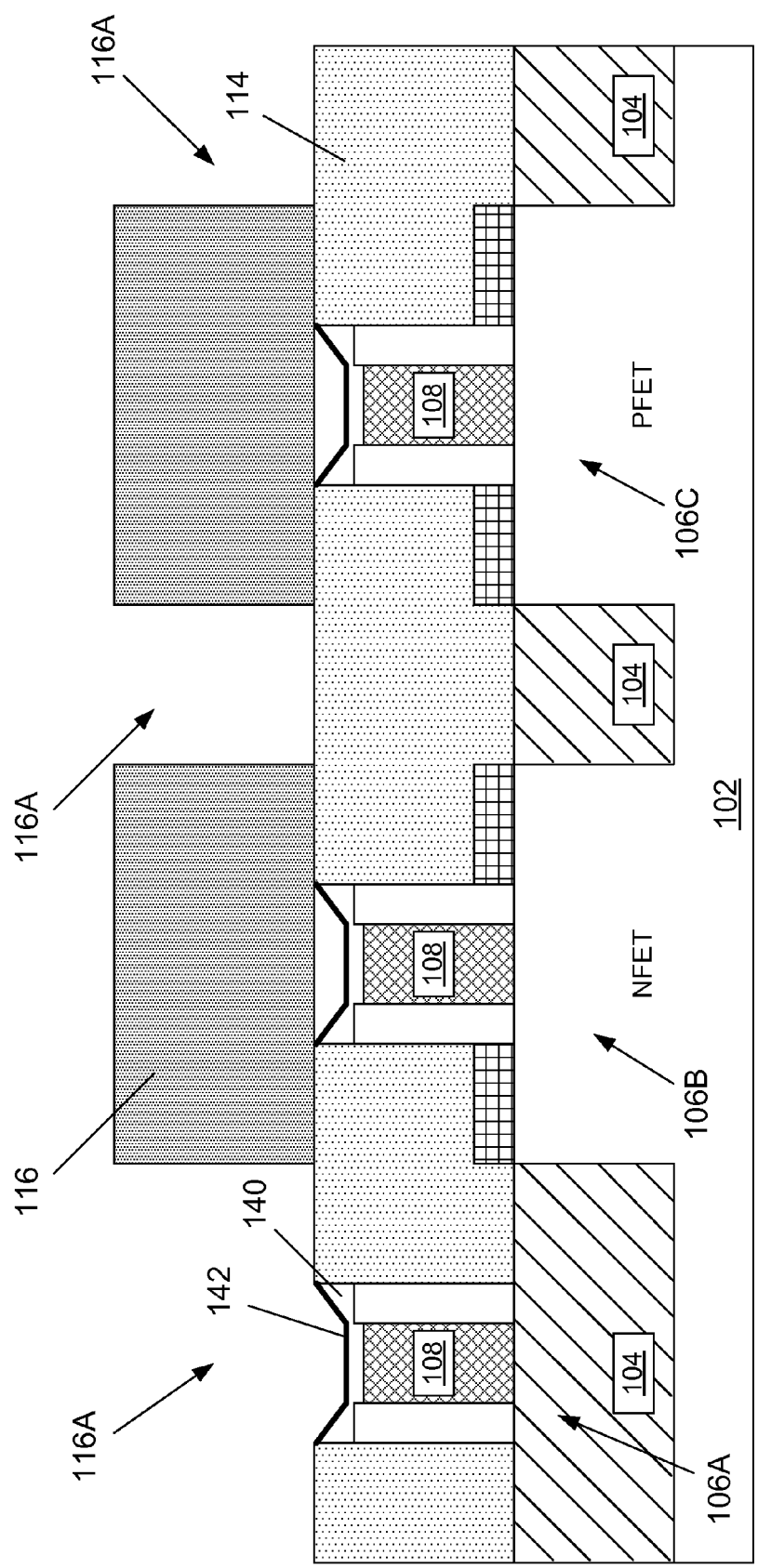

FIG. 3I depicts the product 100 after an etching process was performed to remove the second gate cap material layer 144 positioned above the first gate 106A. The etching process removes the second gate cap material layer 144 selectively relative to surrounding materials.

Figure 3J:
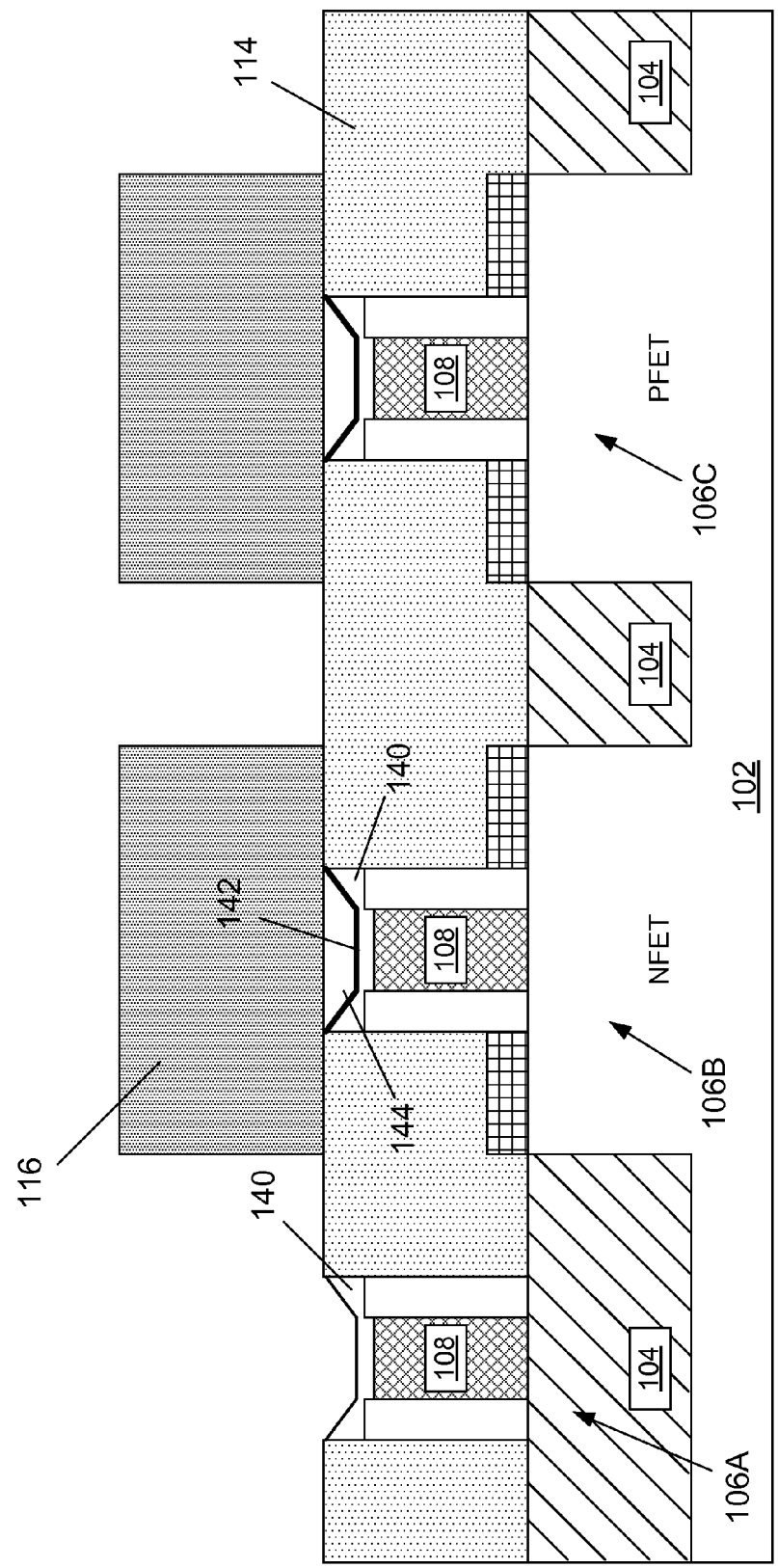

FIG. 3J depicts the product 100 after an etching process was performed to remove the high-k protection layer 142 positioned above the first gate 106A. The etching process removes the high-k protection layer 142 selectively relative to surrounding materials. In this embodiment, the first gate cap material layer 140 corresponds to the reduced thickness gate cap layer 112A discussed above. In this embodiment, the gate cap positioned above the active region is comprised of multiple layers of material (140, 142 and 144), while the portion of the gate cap positioned above the isolation region is made of only a subset of the aforementioned layers, namely the first gate cap material layer 140.

Figure 3K:
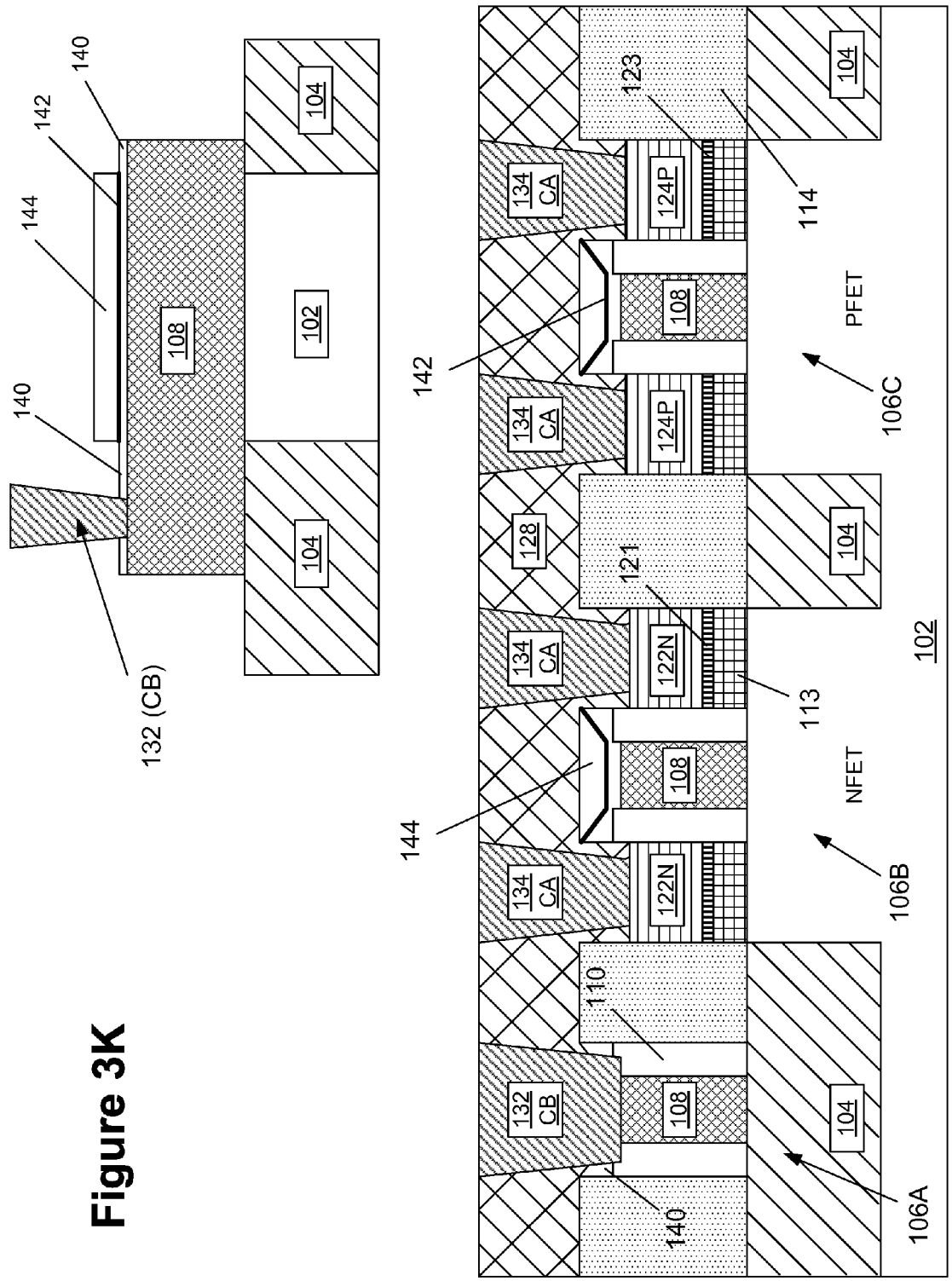

At the point shown in FIG. 3J, the process flow described above with respect to FIGS. 2A-2P may be performed to complete the device. Accordingly, FIG. 3K depicts the device 100 after the formation of the above-described gate contact 132(CB) and the source/drain contacts 134(CA). FIG. 3K also contains a cross-sectional view of the gate structure that corresponds to the cross-sectional view (C-C) depicted in FIG. 2P for the embodiment wherein the gate cap layer 112 was formed from a single layer of material. Note that the novel multi-layer gate cap structure remains positioned above the gate structures 108 of the NFET and PFET devices. In the depicted example, the multi-layer gate cap structure is comprised of the first gate cap material layer 140, the gate cap protection layer 142 and the second gate cap material layer 144. Also note that, even if some of the multi-layer gate cap structure is removed, i.e., a portion of the second gate cap material layer 144 is removed during the contact etch process, the underlying high-k protection layer 142 still provides protection to the underlying gate structure 108 during the contact formation process. That is, the portion of the gate cap positioned above the isolation region 104 has a unique material composition, i.e., the first gate cap material 140 only, that is different from the material composition of the portion of the gate cap positioned above the active region 102, i.e., the first gate cap material layer 140, the high-k protection layer 142 and the second gate cap material layer 144.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming conductive structures for a transistor device formed above an active region of a semiconducting substrate surrounded by an isolation region, the method comprising:

forming a gate structure that is positioned above said active region and said isolation region;

forming a gate cap layer above said gate structure, said gate cap layer having substantially a same initial thickness profile above the entire gate structure;

performing at least one recess etching process on a first portion of said gate cap layer positioned above said isolation region while masking a second portion of said gate cap layer positioned above said active region so as to thereby define a modified gate cap layer comprising a modified first portion having a modified thickness profile positioned above said isolation region and said second portion having said initial thickness profile positioned above said active region, said modified thickness profile having a reduced-thickness portion relative to said initial thickness profile;

forming a gate contact opening that extends through said reduced-thickness portion of said modified gate cap layer and exposes said gate structure; and forming a gate contact in said gate contact opening.

2. The method of claim 1, wherein forming said gate cap layer comprises forming a gate cap layer made of a single layer of material.

3. The method of claim 1, wherein forming said gate cap layer comprises forming a gate cap layer made of multiple layers of material.

4. The method of claim 3, wherein performing said at least one first recess etching process so as to thereby define said modified first portion of said modified gate cap layer comprises removing at least one, but not all, of said multiple layers of material.

5. The method of claim 1, wherein said transistor device is one of a planar transistor device or a FinFET device.

6. The method of claim 1, wherein said modified first portion of said modified gate cap layer consists of a single layer of material.

7. The method of claim 1, wherein said second portion of said modified gate cap layer has a multi-layer structure and said modified first portion of said modified gate cap layer has a single layer structure.

8. The method of claim 1, wherein, after performing said at least one recess etching process, said modified gate cap layer has a stepped profile when viewed in cross-section taken through said modified gate cap layer in a direction parallel to a long axis of said gate structure.

9. A method of forming conductive structures for a transistor device formed above an active region of a semiconducting substrate surrounded by an isolation region, the method comprising:

forming a gate structure above said active region and said isolation region;

forming a gate cap layer above said gate structure;

forming at least one layer of material above said active region;

forming an opening in said at least one layer of material, said opening exposing source/drain regions of said transistor and a first portion of said gate cap layer positioned above said active region;

forming a conductive material above said exposed source/drain regions and above said first portion of said gate cap layer;

performing a first recess etching process on a second portion of said gate cap layer positioned above said isolation region so as to thereby define a reduced-thickness second portion of said gate cap layer positioned above said isolation region;

performing at least one second recess etching process to recess said conductive material so as to define separate initial source/drain contacts positioned on opposite sides of said gate structure;

forming an insulating material above said source/drain contacts and above said reduced-thickness second portion of said gate cap layer;

performing a common etching process sequence through a patterned masking layer to define a gate contact opening that extends through said reduced-thickness second portion of the gate cap layer and to define a plurality of separate source/drain contact openings in said layer of insulating material, each of which are positioned above one of said initial source/drain contacts;

forming a conductive gate contact structure in said gate contact opening such that said conductive gate contact structure is conductively coupled to said gate structure; and forming a conductive source/drain contact structure in each of said source/drain contact openings such that said conductive source/drain contact structure is conductively coupled to an underlying initial source/drain contact.

10. The method of claim 9, wherein said source/drain regions comprise an epi semiconductor material and wherein forming said opening in said at least one layer of material exposes said epi semiconductor material in said source/drain regions.

11. The method of claim 9, wherein forming said at least one layer of material comprises forming first and second layers of silicon dioxide.

12. The method of claim 9, wherein said transistor device is one of a planar transistor device or a FinFET device.

13. The method of claim 9, wherein said gate cap layer consists of a single layer of material.

14. The method of claim 9, wherein said first portion of said gate cap layer has a multi-layer structure and said reduced-thickness second portion of said gate cap layer has a single layer structure.

15. The method of claim 9, wherein, after performing said first recess etching process, said gate cap layer has a stepped profile when viewed in cross-section taken through said gate cap layer in a direction parallel to a long axis of said gate structure.

16. A method, comprising:

forming an isolation region in a semiconducting substrate, said isolation region surrounding and defining an active region in said semiconducting substrate;

forming a gate structure above said semiconducting substrate, a first portion of said gate structure extending across said active region and a second portion of said gate structure extending across said isolation region;

forming an initial gate cap layer above said gate structure, said initial gate cap layer comprising a plurality of material layers;

masking a first gate cap portion of said initial gate cap layer formed above said first portion of said gate structure and exposing a second gate cap portion of said initial gate cap layer formed above said second portion of said gate structure;

performing at least one etching process on said exposed second gate cap portion to remove at least one of said plurality of material layers comprising said initial gate cap layer selectively to at least one underlying layer of said plurality of material layers so as to form a modified gate cap layer comprising said first gate cap portion and a modified second gate cap portion having a reduced-thickness portion relative to said first gate cap portion;

forming a layer of insulating material above said modified gate cap layer;

forming a gate contact opening extending through said layer of insulating material and through said reduced-thickness portion of said modified second gate cap portion of said modified gate cap layer, said gate contact opening exposing said second portion of said gate structure; and forming a gate contact in said gate contact opening.

17. The method of claim 16, wherein, after performing said at least one etching process, said modified gate cap layer has a stepped profile when viewed in cross-section taken through said modified gate cap layer in a direction parallel to a long axis of said gate structure.

* * * * *